(12) United States Patent
Horibe et al.

(10) Patent No.: US 12,456,656 B2
(45) Date of Patent: Oct. 28, 2025

(54) MULTICHIP INTERCONNECT PACKAGE

(71) Applicant: International Business Machines Corporation, Armonk, NY (US)

(72) Inventors: Akihiro Horibe, Yokohama (JP); Toyohiro Aoki, Yokohama (JP); Chinami Marushima, Urayasu (JP); Takahito Watanabe, Yokohama (JP); Takashi Hisada, Hachiouji (JP)

(73) Assignee: International Business Machines Corporation, Armonk, NY (US)

( * ) Notice: Subject to any disclaimer, the term of this patent is extended or adjusted under 35 U.S.C. 154(b) by 542 days.

(21) Appl. No.: 17/942,149

(22) Filed: Sep. 11, 2022

(65) Prior Publication Data

US 2023/0307307 A1 Sep. 28, 2023

Related U.S. Application Data

(63) Continuation-in-part of application No. 17/704,061, filed on Mar. 25, 2022.

(51) Int. Cl.
*H01L 23/31* (2006.01)
*H01L 21/56* (2006.01)
*H01L 23/00* (2006.01)
*H01L 23/538* (2006.01)
(Continued)

(52) U.S. Cl.
CPC ........ *H01L 23/3185* (2013.01); *H01L 21/563* (2013.01); *H01L 23/5383* (2013.01); *H01L 24/16* (2013.01); *H01L 24/32* (2013.01); *H01L 24/73* (2013.01); *H01L 25/0655* (2013.01); *H01L 25/50* (2013.01); *H01L 2224/16227* (2013.01); *H01L 2224/32225* (2013.01); *H01L 2224/73204* (2013.01)

(58) Field of Classification Search
CPC ............... H01L 23/3185; H01L 21/563; H01L 23/3178
See application file for complete search history.

(56) References Cited

U.S. PATENT DOCUMENTS

| 5,780,924 A | 7/1998 | McCormick |
| 9,653,428 B1 | 5/2017 | Hiner et al. |
| 10,833,051 B2 | 11/2020 | Arvin et al. |

(Continued)

OTHER PUBLICATIONS

Adamson, Steven J., "Jet Dispensing Underfills for Stacked Die Applications", Published in Amtest, Proc. Assembly Technology Expo, 2004, 5 pages, http://amtest-group.hu/uploads/Jet%20Dispensing%20Underfills%20for%20Stacked%20Die%20Applications.pdf.

(Continued)

*Primary Examiner* — Errol V Fernandes
(74) *Attorney, Agent, or Firm* — Yuanmin Cai; Otterstedt & Kammer PLLC

(57) ABSTRACT

An interconnected semiconductor subassembly structure includes an interconnect structure; a first semiconductor die bonded to a first portion of a top surface of the interconnect structure; a second semiconductor die bonded to a second portion of the top surface of the interconnect structure; and a resin layer located within at least a first portion of a gap between the first semiconductor die and the second semiconductor die, wherein at least one of a top surface and a bottom surface of the resin layer located within the at least first portion of the gap has a concave meniscus shape.

22 Claims, 21 Drawing Sheets

(51) Int. Cl.
*H01L 25/00* (2006.01)
*H01L 25/065* (2023.01)

(56) References Cited

U.S. PATENT DOCUMENTS

| | | | |
|---|---|---|---|
| 11,404,379 | B2 | 8/2022 | Farooq et al. |
| 11,973,058 | B2 | 4/2024 | Sakuma et al. |
| 2009/0079060 | A1 | 3/2009 | Bartley |
| 2009/0189279 | A1* | 7/2009 | How ................ H01L 24/94 |
| | | | 438/114 |
| 2013/0062760 | A1 | 3/2013 | Hung et al. |
| 2019/0088607 | A1 | 3/2019 | Wang |
| 2019/0096851 | A1 | 3/2019 | Liao |
| 2021/0020531 | A1* | 1/2021 | Cetegen ............ H01L 24/32 |
| 2021/0183773 | A1 | 6/2021 | Rubin |
| 2022/0310501 | A1* | 9/2022 | Wang ............... H01L 23/3128 |
| 2023/0060756 | A1* | 3/2023 | Lai .................... H01L 23/49822 |
| 2023/0307372 | A1 | 9/2023 | Horibe et al. |

OTHER PUBLICATIONS

Horibe et al., "Super Fine Jet Underfill Dispense Technique for Robust Micro Joint in Direct Bonded Heterogeneous Integration (DBHi) Silicon Bridge Packages", 5 pages, provided by Inventor Feb. 2022, Grace Period Disclosure document.

Horibe et al., "Super Fine Jet Underfill Dispense Technique for Robust Micro Joint in Direct Bonded Heterogeneous Integration (DBHi) Silicon Bridge Packages", Oct. 2021, 1 page, Abstract Only, Grace Period Disclosure document.

Miyazawa et al., "CFD Simulation Analysis and Experimental Study of Capillary Underfill Flow in Heterogeneous Integration", 2021 IEEE 71st Electronic Components and Technology Conference (ECTC), Jun. 1-Jul. 4, 2021, DOI: 10.1109/ECTC32696.2021.00172, pp. 1050-1056.

Sikka et al., "Direct Bonded Heterogeneous Integration (DBHi) Si Bridge," 2021 IEEE 71st Electronic Components and Technology Conference (ECTC), 2021, pp. 136-147, doi: 10.1109/ECTC32696.2021.00034.

Super Fine Jet Underfill Dispense Technique for Robust Micro Joint in Direct Bonded Heterogeneous Integration (DBHi) Silicon Bridge Packages, Akihiro Horibe, Chinami Marushima, Takahito Watanabe, Aakrati Jain, Eric Turcotte, Isabel de Sousa, Kamal Sikka, Takashi Hisada, In 2022 IEEE 72nd Electronic Components and Technology Conference (ECTC) May 31, 2022 (pp. 631-634). IEEE. grace period disclosure.

NAMICS Corporation, Flip Chip Underfills (Encapsulants), Downloaded From https://www.namics.co.jp/en/products/underfill-flipchip/ Sep. 4, 2022, 4 Pages.

Vladimir Koifman et al., Hybrid Bonding Review, Image Sensors World, Oct. 1, 2020, downloaded from http://image-sensors-world.blogspot.com/2020/10/hybrid-bonding-revie . . . Sep. 4, 2022, 8 pages.

Kim Yess, Solving Fan-Out Wafer-Level Warpage Challenges Using Material Science, Semiconductor Engineering, Sep. 10, 2018, downlaoded Sep. 4, 2022 from https://semiengineering.com/solving-fan-out-wafer-level-warpage-chall . . . , 7 pages.

* cited by examiner

FIG. 9G (label)

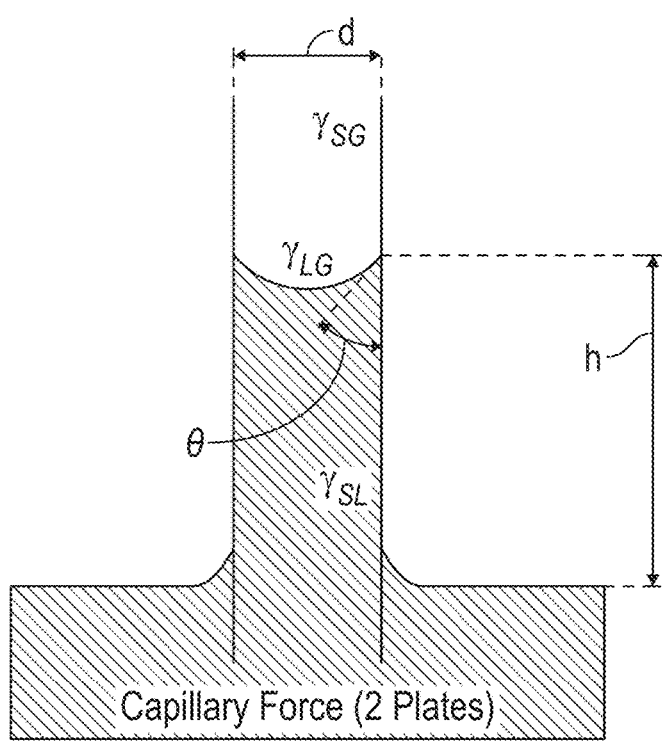
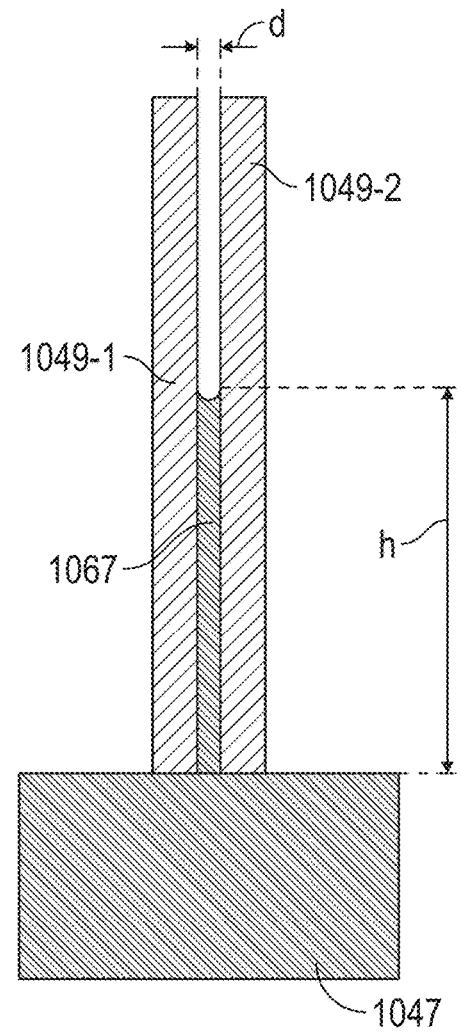
FIG. 15A
FIG. 15B

MULTICHIP INTERCONNECT PACKAGE

CROSS-REFERENCE TO RELATED APPLICATIONS

This application is a continuation-in-part of co-assigned U.S. patent application Ser. No. 17/704,061 filed 25 Mar. 2022, entitled MULTICHIP INTERCONNECT PACKAGE FINE JET UNDERFILL, of inventors Akihiro Horibe et al., the complete disclosure of which is expressly incorporated herein, in its entirety, for all purposes.

STATEMENT REGARDING PRIOR DISCLOSURES BY THE INVENTOR OR A JOINT INVENTOR

The following disclosures are submitted under 35 U.S.C. 102(b)(1)(A):

Super Fine Jet Underfill Dispense Technique for Robust Micro Joint in Direct Bonded Heterogenous Integration (DBHi) Silicon Bridge Packages, Akihiro Horibe, Chinami Marushima, Takahito Watanabe, Aakrati Jain, Eric Turcotte, Isabel de Sousa, Takashi Hisada, Kamal Sikka, October 2021, ABSTRACT only submitted online to IEEE.

Super Fine Jet Underfill Technique for Robust Micro Joint in Direct Bonded Heterogenous Integration (DBHi) Silicon Bridge Packages, Akihiro Horibe, Chinami Marushima, Takahito Watanabe, Aakrati Jain, Eric Turcotte, Isabel de Sousa, Takashi Hisada, Kamal Sikka, February 2022, pages 1-5, submitted online to IEEE.

Super Fine Jet Underfill Dispense Technique for Robust Micro Joint in Direct Bonded Heterogeneous Integration (DBHi) Silicon Bridge Packages, Akihiro Horibe, Chinami Marushima, Takahito Watanabe, Aakrati Jain, Eric Turcotte, Isabel de Sousa, Kamal Sikka, Takashi Hisada, In 2022 IEEE 72nd Electronic Components and Technology Conference (ECTC) 2022 May 31 (pp. 631-634). IEEE.

BACKGROUND

The present invention relates generally to the field of integrated circuit packaging, and more particularly to improving the structural integrity and reliability of multi-chip packages.

In electronics, a three-dimensional (3D) integrated circuit (IC) is a chip or combination of chips in which two or more layers of active electronic components are integrated both vertically and horizontally into a single circuit. 3D packaging saves space by stacking separate chips in a single package. A multi-chip module (MCM) is a specialized electronic package where multiple integrated circuits (ICs), semiconductor dies or other discrete components are packaged onto a unifying substrate, facilitating their use as a single component. The MCM itself will often be referred to as a "chip" in designs, thus illustrating its integrated nature. This packaging, known as a System in Package (SiP) or a Chip Stack MCM, does not integrate the chips into a single circuit. Instead, the chips in the package communicate using off-chip signaling, much as if they were mounted in separate packages on a normal circuit board.

A SiP includes a number of integrated circuits enclosed in a single module (i.e., package). The SiP performs all or most of the functions of an electronic system, and is typically used, for example, inside mobile phones, digital music players, and the like. Dies containing integrated circuits may be stacked vertically on a substrate. In some cases, they are internally connected by fine wires that are bonded to the package. Alternatively, with flip chip technology, solder bumps are used to join stacked chips together. SiP dies can be stacked vertically or tiled horizontally, unlike slightly less dense multi-chip modules, which place dies horizontally on a carrier. A SiP connects the dies with standard off-chip wire bonds or solder bumps, unlike slightly denser three-dimensional integrated circuits which connect stacked silicon dies with conductors running through the die. Many different 3-D packaging techniques have been developed for stacking many more-or-less standard chip dies into a compact area.

An example SiP can contain several chips (such as a specialized processor, DRAM (dynamic random access memory), flash memory) combined with passive components, for example resistors and capacitors, which are mounted on the same substrate. This means that a complete functional unit can be built in a multi-chip package, so that few external components need to be added to make it work. This is particularly valuable in space-constrained environments, as it reduces the complexity of the package substrate and the overall design.

SUMMARY

In one aspect, an interconnected semiconductor subassembly structure includes an interconnect structure; a first semiconductor die bonded to a first portion of a top surface of the interconnect structure; a second semiconductor die bonded to a second portion of the top surface of the interconnect structure; and a resin layer located within at least a first portion of a gap between the first semiconductor die and the second semiconductor die, wherein at least one of a top surface and a bottom surface of the resin layer located within the at least first portion of the gap has a concave meniscus shape.

In another aspect, a method of forming an interconnected semiconductor subassembly structure includes bonding a first semiconductor die to a first portion of a top surface of an interconnect structure; bonding a second semiconductor die to a second portion of the top surface of the interconnect structure; and via capillary action, forming a resin layer within at least a first portion of a gap between the first semiconductor die and the second semiconductor die, at least one of a top surface and a bottom surface of the resin layer having a concave meniscus shape.

BRIEF DESCRIPTION OF THE DRAWINGS

The following detailed description, given by way of example and not intend to limit the disclosure solely thereto, will best be appreciated in conjunction with the accompanying drawings, in which:

FIGS. 14A-14G, 15A, 15B, 16A, 16B, and 17A-17E show aspects of pre-binding chip assembly technology, in accordance with at least one embodiment of the present invention.

When viewed as ordered combinations, FIGS. 1-19B illustrate both (i) semiconductor devices and (ii) the methods for forming such semiconductor devices, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
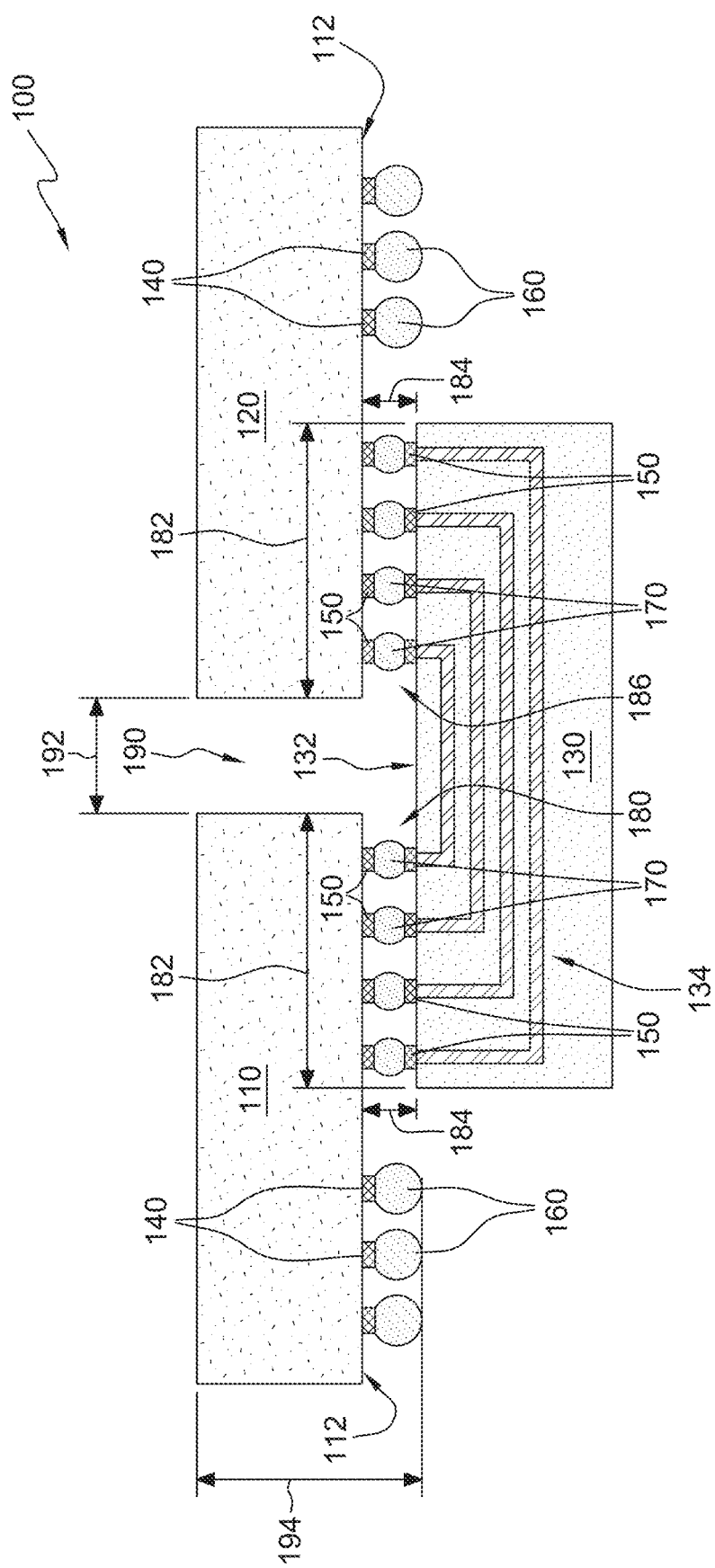
FIG. 1 illustrates a cross-sectional view of an interconnected semiconductor subassembly structure, generally designated, in accordance with at least one embodiment of the present invention.

The present invention relates generally to the field of integrated circuit packaging, and more particularly to improving the structural integrity and reliability of multi-chip packages.

Chip-package interaction (CPI) has become a significant reliability issue for copper (Cu)/low-k chips interconnected by a bridge structure. Reflow soldering is the most widely used method of attaching surface mount components, such as bridged semiconductor dies, to a package substrate, such as a laminate and a printed circuit board (PCB). The aim of the solder reflow process is to form acceptable solder joints by heating and subsequently cooling the surface mount component, PCB, and solder.

However, embodiments of the present invention recognize that during this solder reflow process, thermo-mechanical deformations, and thereby thermal stress, can occur at the solder joints between the chip and the interconnect structure (e.g., interposer or bridge), due to differences in the coefficients of thermal expansion (CTEs) between the chip and the organic substrate. In order to "soften" the CTE mismatch between a chip package having multiple chips interconnected by an interconnect structure, embodiments of the present invention provide for an underfill formed between the chip and the interconnect structure. The underfill provides an additional mechanical bond between the chip and the interconnect structure, which helps to protect the solder microbump joints formed between the chip and the interconnect structure from mechanical stress.

One type of underfill process that can be used for bonding a chip to an interconnect structure is non-conductive paste (NCP) bonding. However, NCP material(s) have a relatively low fracture toughness and adhesion strength, and the bonding process using NCP material(s) can result in filler entrapment issues that further degrade the mechanical strength of the solder joints. Another type of underfill process for bonding a chip to an interconnect structure, such as a bridge, includes dispensing an underfill material from the edge of the chip/bridge subassembly using a jet dispenser. However, dispensing the underfill material from the edge of the chip/bridge subassembly can result in contamination of the standard C4 solder bumps joining the chip to the package substrate, as well as contamination of the backside of the chip and of the bridge structure itself.

Embodiments of the present invention improve upon the foregoing deficiencies of current underfill and soldering processes for multi-chip interconnected structures, and also improve upon the resulting structures, by forming an underfill layer that is located not only between the chips and the interconnect structure, but also between the chips themselves. According to an embodiment of the present invention, an interconnect subassembly (chip-interconnect-chip) structure is formed having two chips attached to respective portions of the top of an interconnect structure, in which the gaps between each respective chip and the interconnect structure, as well at least a portion of the gap between the two chips, are filled with an underfill material prior to mounting the interconnect subassembly structure to an organic substrate. In this embodiment, underfill material is initially deposited within the gap between the two chips, and subsequently flows within the gaps between the chips and the interconnect structure via capillary action. The deposition of the underfill within the gap ultimately allows for an underfill layer to be formed between the chips of the chip-interconnect structure.

By forming an underfill layer in the gap between the chips, in addition to the gaps between the chips and the interconnect structure, the amount of chip movement that must be tolerated during the cooling phase, after soldering the chip-interconnect-chip structure to an organic substrate, is greatly reduced. This ultimately results in a reduction and/or elimination of any micro-joint fractures of the solder microbump joints between the chips and the interconnect structure during the cooling phase. Furthermore, by forming an underfill layer in the gap between the chips, in addition to in the gaps between the chips and the interconnect structure, the chip-interconnect-chip structure can be attached to an organic substrate, such as a package substrate, through a standard reflow processes. Accordingly, the chip-interconnect-chip structures of one or more embodiments of the present invention can be attached to an organic substrate in a shorter amount of time than is required for current practices.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper," "lower," "right," "left," "vertical," "horizontal," "top," "bottom," and derivatives thereof shall relate to the disclosed structures and methods, as oriented in the drawing figures. Terms such as "above," "overlying," "atop," "on top," "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The following description with reference to the accompanying drawings is provided to assist in a comprehensive understanding of exemplary embodiments of the invention as defined by the claims and their equivalents. The description includes various specific details to assist in that understanding, but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of various semiconductor structures and sub-assembly structures, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

The present invention will now be described in detail with reference to the Figures, wherein like reference numerals refer to like elements throughout. FIGS. 1-8 include various cross-sectional views depicting illustrative steps of a method, and the resulting structures thereof, for manufacturing semiconductor devices, and in particular, a chip-interconnect-chip structure having underfill formed between the chips and interconnect, as well as between the chips themselves, according to select embodiments of the present invention. One having ordinary skill in the art will appreciate that there are many options available for the formation of the structures described herein and that the following discussion does not limit embodiments to only the techniques described herein.

Refer now to FIG. 1, which 1 illustrates a cross-sectional view of an interconnected semiconductor subassembly structure, generally designated 100, in accordance with at least one embodiment of the present invention. Interconnected semiconductor subassembly structure 100 includes semiconductor die 110 and semiconductor die 120 electrically interconnected with one another by interconnect structure 130.

Prior to forming interconnected semiconductor subassembly structure 100 as depicted in FIG. 1, bonding pads 140 and bonding pads 150 were initially formed on portions of what is now depicted as bottom side 112 of semiconductor dies 110 and 120, and bonding pads 150 were initially formed on top side 132 of interconnect structure 130. Solder bumps 160 were thereafter formed on top of bonding pads 140 of semiconductor dies 110 and 120. In an embodiment, and as depicted in FIG. 1, solder bumps 160 are C4s (controlled collapse chip connections). Similarly, microbumps 170 were thereafter formed on top of bonding pads 150. In an embodiment, and as depicted in FIG. 1, microbumps 170 are micro C4s that have a smaller diameter and finer pitch as compared to solder bumps 160. In another embodiment, microbumps 170 are micro metal joints that are formed at least partially from a solder or solder alloy. In yet another embodiment, microbumps 170 are micro metal joints that are formed without any solder or solder alloy.

After solder bumps 160 and microbumps 170 were formed on top of bonding pads 140 and 150 located on semiconductor dies 110 and 120, respectively, semiconductor dies 110 and 120 were flipped over or turned upside down, and microbumps 170 were lined up with and attached to corresponding bonding pads 150 located on top side 132 of interconnect structure 130 as depicted in FIG. 1. The attachment of semiconductor dies 110 and 120 to interconnect structure 130 can be completed by heating semiconductor subassembly structure 100, which results in the reflow of microbumps 170, followed by a subsequent cooling period. In an embodiment, formic acid reflow of microbumps 170 can be performed if flux is not used in the soldering process.

After the cooling of semiconductor subassembly structure 100, a solder bond or solder joint is formed between microbumps 170 and bonding pads 150. In embodiments in which solder bumps 160 are attached to bonding pads 140 prior to heating semiconductor subassembly structure 100, solder bumps 160 should be formed from solder that has a higher melting point than microbumps 170 to ensure that the reflow of solder bumps 160 does not occur at this point. However, in embodiments in which solder bumps 160 are attached to bonding pads 140 after heating semiconductor subassembly structure 100, solder bumps may be formed from solder that has the same or similar melting point as microbumps 170.

Semiconductor dies 110 and 120 can be made from any generally known semiconductor materials (e.g., silicon, gallium arsenide, or germanium) and includes an integrated circuit formed thereon. As depicted in FIG. 1, semiconductor dies 110 and 120 are flip chips.

Interconnect structure 130 is a bridge that is configured to route electrical signals between semiconductor dies 110 and 120. Interconnect structure 130 can be made from any generally known bridge materials (e.g., glass, organic, or silicon based materials). In an embodiment, interconnect structure 130 can be made from a semiconductor material, such as, but not limited to, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment, interconnect structure 130 can be made from a dielectric material such as, for example, undoped glass or doped glass. In another embodiment, interconnect structure 130 can be made from a metal such as, for example, titanium (Ti), vanadium (V), chromium (Cr), manganese (Mn), iron (Fe), cobalt (Co), nickel (Ni), copper (Cu), molybdenum (Mo) and alloys, oxides and nitrides thereof.

Interconnect wires 134 are routed through various layers of interconnect structure 130 and connected to corresponding microbumps 170 of semiconductor dies 110 and 120, respectively. Interconnect wires 134 provide an electrical interface for communicating or otherwise transferring data between semiconductor dies 110 and 120. Interconnect wires 134 can be formed from any generally known materials for transmitting signal data, including, but not limited to, copper or tungsten wire.

As further depicted in FIG. 1, a gap 180 having a gap length 182 and a gap height 184 exists between bottom side 112 of semiconductor die 110 and top side 132 of interconnect structure 130. Similarly, a gap 186 having a gap length 182 and a gap height 184 exists between bottom side 112 of semiconductor die 120 and top side 132 of interconnect structure 130. Furthermore, a gap 190 having a gap length 192 and a gap height 194 exists between semiconductor dies 110 and 120. Although gaps 180 and 186 are depicted in FIG. 1 as having the same gap length 182, embodiments of the present invention are not necessarily limited to these particular lengths. For example, depending on length of a semiconductor die that is attached to interconnect structure 130, the length of the gap between the portion of the semiconductor die attached to interconnect structure 130 may increase or decrease.

In an embodiment, and as depicted in FIG. 1, gap length 192 of gap 190 is greater than gap height 184 of gaps 180 and 186, respectively. This stems from the fact that in accordance with embodiments of the present invention, an underfill material 310 (depicted in FIG. 3) is initially dispensed within gap 190, and subsequently flows between gaps 180 and 186 via capillary action to form underfill layer 320 (depicted in FIG. 3). In an embodiment, gap length 182 of gaps 180 and 186 is greater than or equal to 50 um and less than or equal to 500 um. In an embodiment, gap height 184 of gaps 180 and 186 is greater than or equal to 5 um and less than or equal to 100 urn.

Figure 2:
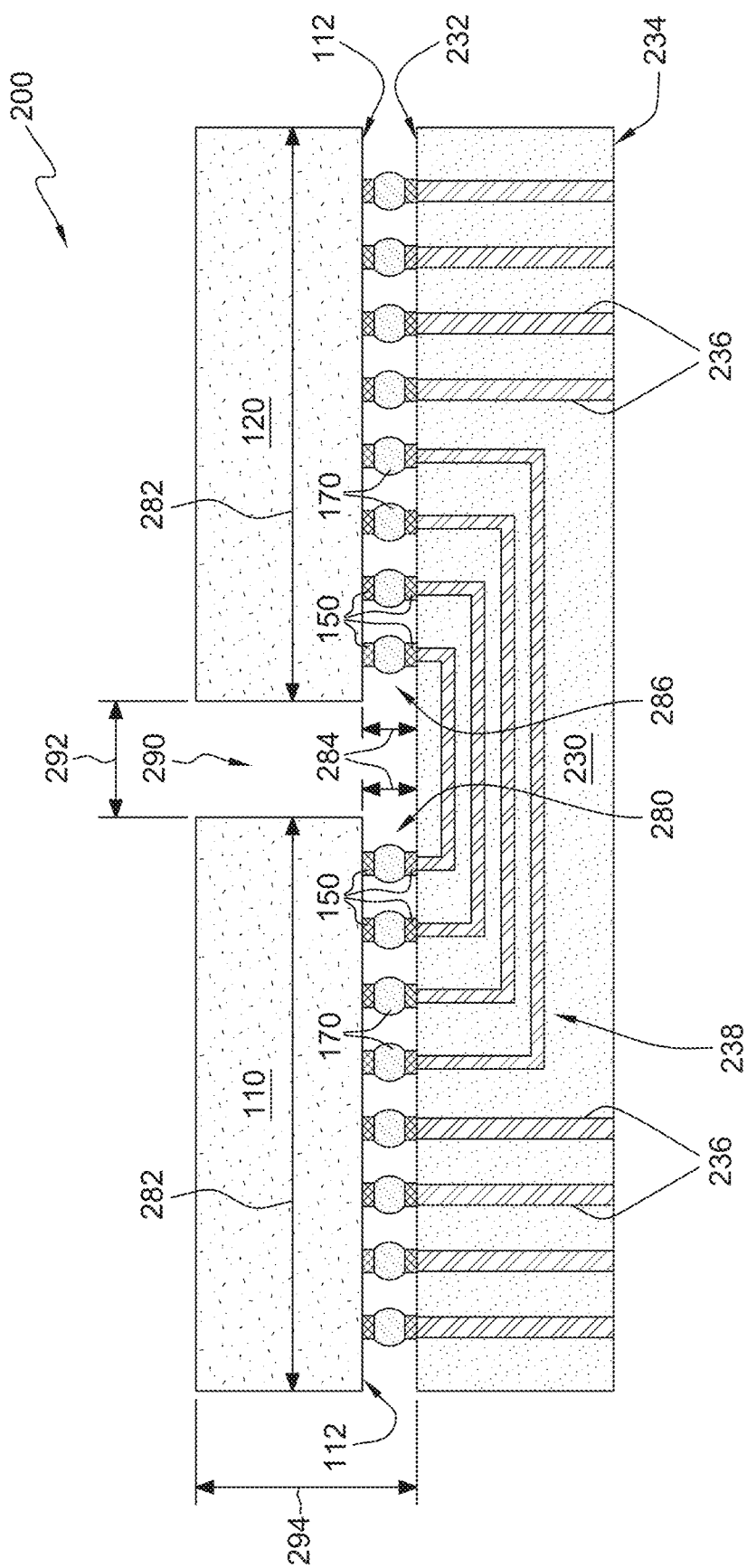
FIG. 2 illustrates a cross-sectional view of an interconnected semiconductor subassembly structure, generally designated, in accordance with at least one embodiment of the present invention.

Referring now to FIG. 2, FIG. 2 illustrates a cross-sectional view of an interconnected semiconductor subassembly structure, generally designated 200, in accordance with at least one embodiment of the present invention. Interconnected semiconductor subassembly structure 200 includes semiconductor die 110 and semiconductor die 120 electrically interconnected with one another by an interconnect structure 230.

Prior to forming interconnected semiconductor subassembly structure 200 as depicted in FIG. 2, bonding pads 150 were initially formed on portions of what is now depicted as bottom side 112 of semiconductor dies 110 and 120, and bonding pads 150 were also initially formed on top side 232 of interconnect structure 230. Microbumps 170 were thereafter formed on top of bonding pads 150 located on semiconductor dies 110 and 120. In an embodiment, and as depicted in FIG. 1, microbumps 170 are micro C4s that have a smaller diameter and finer pitch as compared to solder bumps 160. In another embodiment, microbumps 170 are micro metal joints that are formed at least partially from a solder or solder alloy. In yet another embodiment, microbumps 170 are micro metal joints that are formed without any solder or solder alloy.

After microbumps 170 are formed on top of bonding pads 150 located on semiconductor dies 110 and 120, respectively, semiconductor dies 110 and 120 were flipped over or turned upside down, and microbumps 170 were lined up with and attached to corresponding bonding pads 150 located on top side 232 of interconnect structure 230. The attachment of semiconductor dies 110 and 120 to interconnect structure 230 can be completed by heating semiconductor subassembly structure 200, which results in the reflow of microbumps 170, followed by a subsequent cooling period. In an embodiment, formic acid reflow of microbumps 170 can be performed if flux is not used in the soldering process.

After the cooling of semiconductor subassembly structure 200, a solder bond or solder joint is formed between microbumps 170 and bonding pads 150. In embodiments in which solder bumps 160 (not depicted) are attached to bonding pads 140 (not depicted) on bottom side 234 of interconnect structure 230 prior to heating semiconductor subassembly structure 200, solder bumps 160 should be formed from solder that has a higher melting point than microbumps 170 to ensure that the reflow of solder bumps 160 does not occur at this point. However, in embodiments in which solder bumps 160 (not depicted) are attached to bonding pads 140 (not depicted) on bottom side 234 of interconnect structure 230 (not depicted in FIG. 2) after heating semiconductor subassembly structure 200, microbumps may be formed from solder that has the same or similar melting point as microbumps 170.

In an embodiment, and as depicted in FIG. 2, interconnect structure 230 is an interposer that is configured to route electrical signals between semiconductor dies 110 and 120. Interconnect structure 230 can made from any generally known interposer materials (e.g., glass, organic, or silicon based materials). In an embodiment, interconnect structure can be made from a semiconductor material, such as, but not limited to, silicon (Si), germanium (Ge), a silicon germanium (SiGe) alloy, a silicon carbide (SiC) alloy, a silicon germanium carbide (SiGeC) alloy, or a III/V compound semiconductor (e.g., InAs, GaAs or InP). In another embodiment, interconnect structure 230 can be made from a dielectric material such as, for example, undoped glass or doped glass. In another embodiment, interconnect structure 230 can be made from a metal such as, for example, titanium (Ti), vanadium (V), chromium (Cr), manganese (Mn), iron (Fe), cobalt (Co), nickel (Ni), copper (Cu), molybdenum (Mo) and alloys, oxides and nitrides thereof.

A plurality of through hole vias (THVs) 236 are formed through interconnect structure 230 that provide an electrical pathway between top side 232 and bottom side 234 of interconnect structure 230. In an embodiment where interconnect structure 230 is a silicon interposer, THVs 236 are through silicon vias (TSVs). In an embodiment where interconnect structure 230 is a glass interposer, THVs 236 are through glass vias (TGVs). In an embodiment where interconnect structure 230 is a ceramic interposer, THVs 236 are through ceramic vias (TCVs). A plurality of interconnect wires 238 are routed through various layers of interconnect structure 230 and connected to corresponding microbumps 170 of semiconductor dies 110 and 120, respectively. Interconnect wires 238 provide an electrical interface for communicating or otherwise transferring data between semiconductor dies 110 and 120. Interconnect wires 238 can be formed from any generally known materials for transmitting signal data, including, but not limited to, copper or tungsten wire.

As further depicted in FIG. 2, a gap 280 having a gap length 282 and a gap height 284 exists between bottom side 112 of semiconductor die 110 and top side 232 of interconnect structure 230. Similarly, a gap 286 having a gap length 282 and a gap height 284 exists between bottom side 112 of semiconductor die 120 and top side 232 of interconnect structure 230. A gap 290 having a gap length 292 and a gap height 294 also exists between semiconductor dies 110 and 120. Although gaps 180 and 186 are depicted in FIG. 2 as having the same gap length 282, embodiments of the present invention are not necessarily limited to these particular lengths. For example, depending on length of a semiconductor die that is attached to interconnect structure 230, the length of the gap between the portion of the semiconductor die attached to interconnect structure 230 may increase or decrease.

In an embodiment, and as depicted in FIG. 2, gap length 292 of gap 290 is greater than gap height 284 of gaps 280 and 286, respectively. This stems from the fact that in accordance with embodiments of the present invention, an underfill material 410 (depicted in FIG. 4) is initially dispensed between gap 290, and subsequently flows between gaps 280 and 286 via capillary action to form underfill layer 420 (depicted in FIG. 4) within gaps 280, 286, and 290. In an embodiment, gap length 282 of gaps 280 and 286 is greater than or equal to 50 um and less than or equal to 500 um. In an embodiment, gap height 284 of gaps 280 and 286 is greater than or equal to 5 um and less than or equal to 100 um.

Figure 3:
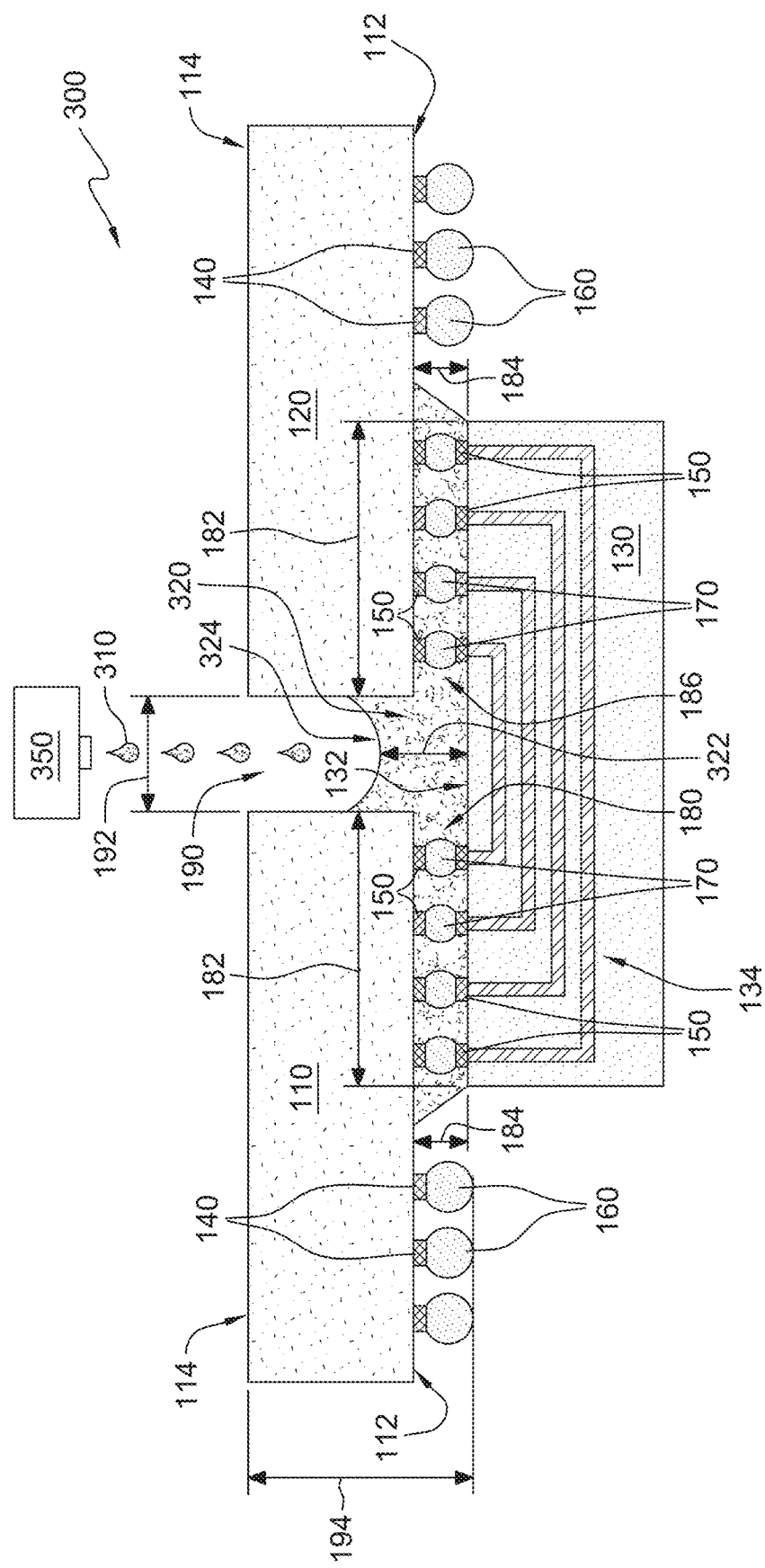
FIG. 3 is a cross-sectional view of interconnected semiconductor subassembly structure 100 after formation of an underfill layer, generally depicted as subassembly structure, in accordance with at least one embodiment of the present invention.

Referring now to FIG. 3, FIG. 3 is a cross-sectional view of interconnected semiconductor subassembly structure 100 after formation of an underfill layer 320, generally depicted as subassembly structure 300, in accordance with at least one embodiment of the present invention. As depicted in FIG. 3, underfill material 310 has been deposited and cured to form underfill layer 320. Specifically, underfill layer 320 is formed in and completely fills gap 180 between bottom side 112 of semiconductor die 110 and top side 132 of interconnect structure 130, is formed in and completely fills gap 186 between bottom side 112 of semiconductor die 120 and top side 132 of interconnect structure 130, and is formed in and partially fills gap 190 between semiconductor dies 110 and 120. In an embodiment, underfill material 310 deposited within gap 190 self-cures as additional underfill material 310 is deposited, thus reducing the number of processing steps. In another embodiment, underfill material 310 only partially cures during the deposition of underfill material 310 and an additional post-cure processing step is performed.

Underfill material 310 can be any underfill materials known in the art. For example, underfill material 310 may be a composite material made up of a resin, such as an epoxy polymer, and can include one or more additional elements, including, but not limited to, filler materials, flow agents, adhesion promoters, and dyes. In an embodiment in which one or more filler materials are used, the filler material is a relatively fine (e.g., less than or equal to a maximum diameter or less than or equal to an average diameter). In an embodiment, the filler material of underfill material 310 has a maximum diameter less than or equal to 1.2 um and an average diameter less than or equal to 0.3 um. However, embodiments of the present invention are not necessarily limited to these particular dimensions. In an embodiment, underfill material 310 is a capillary underfill. In an embodiment, underfill material 310 has a CTE that is within a predetermined threshold of that of microbumps 170. In an embodiment, underfill material 310 has a relatively low viscosity (e.g., 35 pascal second (Pa-s)). However, embodiments of the present invention may be practiced using an underfill material that has a viscosity that is less than or greater than 35 Pa-s.

Underfill material 310 is deposited within gap 190 between semiconductor dies 110 and 120 via dispenser 350. Dispenser 350 may be representative of any underfill material or chip binding material dispensing techniques known in the art. In an embodiment, dispenser 350 is an auger or linear positive displacement pump with a needle. In another embodiment, dispenser 350 is a jet dispenser. In an embodiment where dispenser 350 is a jet dispenser, dispenser 350 may be a piezo jet dispenser, a pressure jet dispenser, a mechanical jet dispenser, a thermal jet dispenser, or a continuous jet dispenser. In an embodiment where dispenser 350 is a jet dispenser, the jet dispenser includes a fine dispensing nozzle or needle. For example, the nozzle or needle diameter of dispenser 350 may be 50 um. However, embodiments of the present invention may be practiced with a jet dispenser having a nozzle size that is less than or greater than 50 um depending on the gap dimensions of gaps 180, 186, and 190.

In an embodiment, dispenser 350 dispenses underfill material 310 between gap 190 from a fixed vertical position relative to a top surface 114 of semiconductor dies 110 and 120, and a fixed horizontal position relative to gap length 192 of gap 190. In another embodiment, dispenser 350 moves back and forth along an x-axis with respect to gap length 192 of gap 190 as dispenser 350 dispenses dots of underfill material 310 to form multiple lines of underfill material. This technique is commonly referred to as "jetting on the fly."

The amount of underfill material 310 that is required to be deposited between gap 190 of semiconductor dies 110 and 120 is based, at least in part, on the volume of gaps 180 and 186, minus the volume of microbumps 170 located within gaps 180 and 186, plus a particular volume of gap 190 to reach a predetermined height 322 of underfill layer 320 within gap 190 between semiconductor dies 110 and 120. In an embodiment, the amount of underfill material 310 dispensed can be controlled based on the dot size of underfill material 310 dispensed and the number of dots dispensed. It should be appreciated that by dispensing a controlled amount of underfill material between gap 190 located between semiconductor dies 110 and 120 prior to attaching semiconductor structure 300 to an organic substrate, such as package substrate 710 (depicted in FIG. 700), gaps 180 and 186 can be completely filled with underfill material 310 without any excess underfill material 310 contaminating any neighboring solder bumps 160 located on bottom surface of processor dies 110 and 120.

In an embodiment, and as depicted in FIG. 3, a top surface 324 of underfill layer 320 formed within gap 190 has a concave meniscus shape. This concave meniscus shape is formed due to the surface tension of underfill material 310 along the sides of semiconductor dies 110 and 120 that form gap 190. In an embodiment, and as depicted in FIG. 1, height 322 of underfill layer 320 within gap 190 is precalculated based on a maximum amount of underfill material 310 that can be dispensed within gap 190 without any excess underfill material 310 forming outside of gaps 180 and 186 in a lengthwise direction towards solder balls 160.

Figure 4:
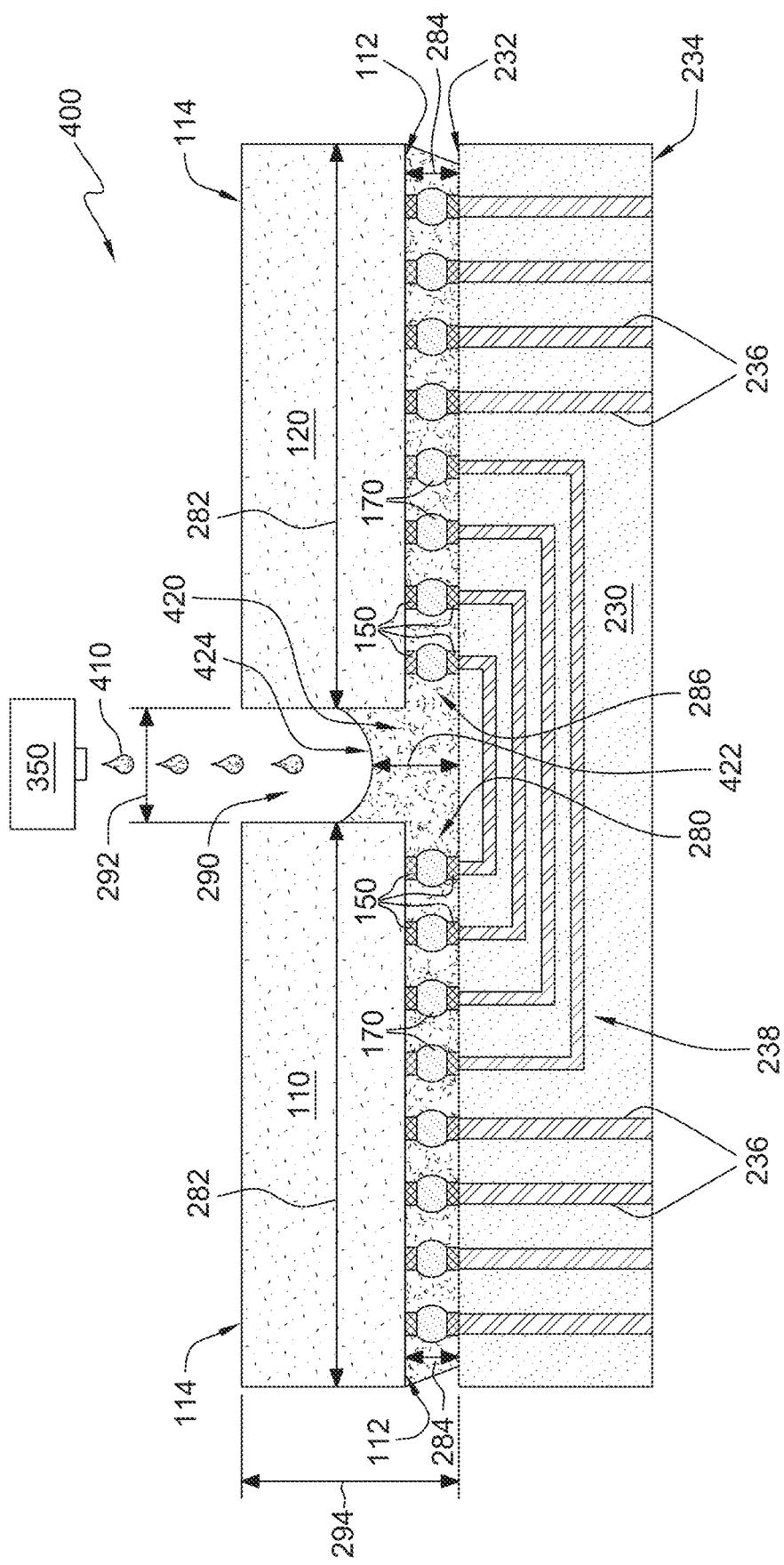
FIG. 4 is a cross-sectional view of interconnected semiconductor subassembly structure 200 after formation of an underfill layer, generally depicted as interconnected semiconductor subassembly structure, in accordance with at least one embodiment of the present invention.

Referring now to FIG. 4, FIG. 4 is a cross-sectional view of interconnected semiconductor subassembly structure 200 after formation of an underfill layer 420, generally depicted as interconnected semiconductor subassembly structure 400, in accordance with at least one embodiment of the present invention. As depicted in FIG. 4, underfill material 410 has been deposited and cured to form underfill layer 420. Specifically, underfill layer 420 is formed in and completely fills gap 280 between bottom side 112 of semiconductor die 110 and top side 232 of interconnect structure 230, is formed in and completely fills gap 286 between bottom side 112 of semiconductor die 120 and top side 232 of interconnect structure 230, and is formed in and partially fills gap 290 between semiconductor dies 110 and 120. In an embodiment, underfill material 410 deposited within gap 190 self-cures as additional underfill material 410 is deposited, thus reducing the number of processing steps. In another embodiment, underfill material 410 only partially cures during the deposition of underfill material 410 and an additional post-cure processing step is performed.

Underfill material 410 can be any underfill materials known in the art. For example, underfill material 410 may be a composite material made up of a resin, such as an epoxy polymer, and can include one or more additional elements, including, but not limited to, filler materials, flow agents, adhesion promoters, and dyes. In an embodiment in which one or more filler materials are used, the filler materials of underfill material 410 are relatively fine (e.g., less than or equal to a maximum diameter or less than or equal to an average diameter). In an embodiment, the filler material of underfill material 410 has a maximum diameter less than or equal to 1.2 um and an average diameter less than or equal to 0.3 um. However, embodiments of the present invention are not necessarily limited to these particular dimensions. In an embodiment, underfill material 410 is a capillary underfill. In an embodiment, underfill material 410 has a CTE that is within a predetermined threshold of that of microbumps 170. In an embodiment, underfill material 410 has a relatively low viscosity (e.g., 35 pascal second (Pa-s)). However, embodiments of the present invention may be practiced using an underfill material that has a viscosity that is less than or greater than 35 Pa-s.

Underfill material 410 is deposited within gap 290 between semiconductor dies 110 and 120 via dispenser 350. Dispenser 350 may be representative of any underfill or chip binding material dispensing techniques known in the art. In an embodiment, dispenser 350 is an auger or linear positive displacement pump with a needle. In another embodiment, dispenser 350 is a jet dispenser. In an embodiment where dispenser 350 is a jet dispenser, dispenser 350 may be a piezo jet dispenser, a pressure jet dispenser, a mechanical jet dispenser, a thermal jet dispenser, or a continuous jet dispenser. In an embodiment where dispenser 350 is a jet dispenser, the jet dispenser includes a fine dispensing nozzle or needle. For example, the nozzle or needle diameter of dispenser 350 may be 50 um. However, embodiments of the present invention may be practiced with a jet dispenser having a nozzle size that is less than or greater than 50 um.

In an embodiment, dispenser 350 dispenses underfill material 410 between gap 290 from a fixed vertical position relative to a top surface 114 of semiconductor dies 110 and 120, and a fixed horizontal position relative to gap length 292 of gap 290. In another embodiment, dispenser 350 moves back and forth along an x-axis with respect to gap length 292 of gap 290 as dispenser 350 dispenses dots of underfill material 410 to form multiple lines of underfill material. This technique is commonly referred to as "jetting on the fly."

The amount of underfill material 410 that is required to be deposited between gap 290 of semiconductor dies 110 and 120 is based, at least in part, on the volume of gaps 280 and 286, minus the volume of microbumps 170 located within gaps 280 and 286, plus a particular volume of gap 290 to reach a predetermined height 422 of underfill layer 420 within gap 290 between semiconductor dies 110 and 120. In an embodiment, the amount of underfill material 410 dispensed can be controlled based on the dot size of underfill material 410 dispensed and the number of dots dispensed. It should be appreciated that by dispensing a controlled amount of underfill material 410 between gap 290 located between semiconductor dies 110 and 120 prior to attaching semiconductor structure 400 to a package substrate, such as package substrate 810 (depicted in FIG. 8), gaps 280 and 286 can be completely filled with underfill material 410 without any excess underfill material 410 contaminating any neighboring surfaces outside of gaps 280 and 286.

In an embodiment, and as depicted in FIG. 4, a top surface 424 of underfill layer 420 formed within gap 290 has a concave meniscus shape. This concave meniscus shape is formed due to the surface tension of underfill material 410 along the sides of semiconductor dies 110 and 120 that form gap 290. In an embodiment, and as depicted in FIG. 1, height 422 of underfill layer 420 within gap 290 is precalculated based on a maximum amount of underfill material 410 that can be dispensed within gap 290 without any excess underfill material 410 forming outside of the outermost ends of gaps 280 and 286.

Figure 5:
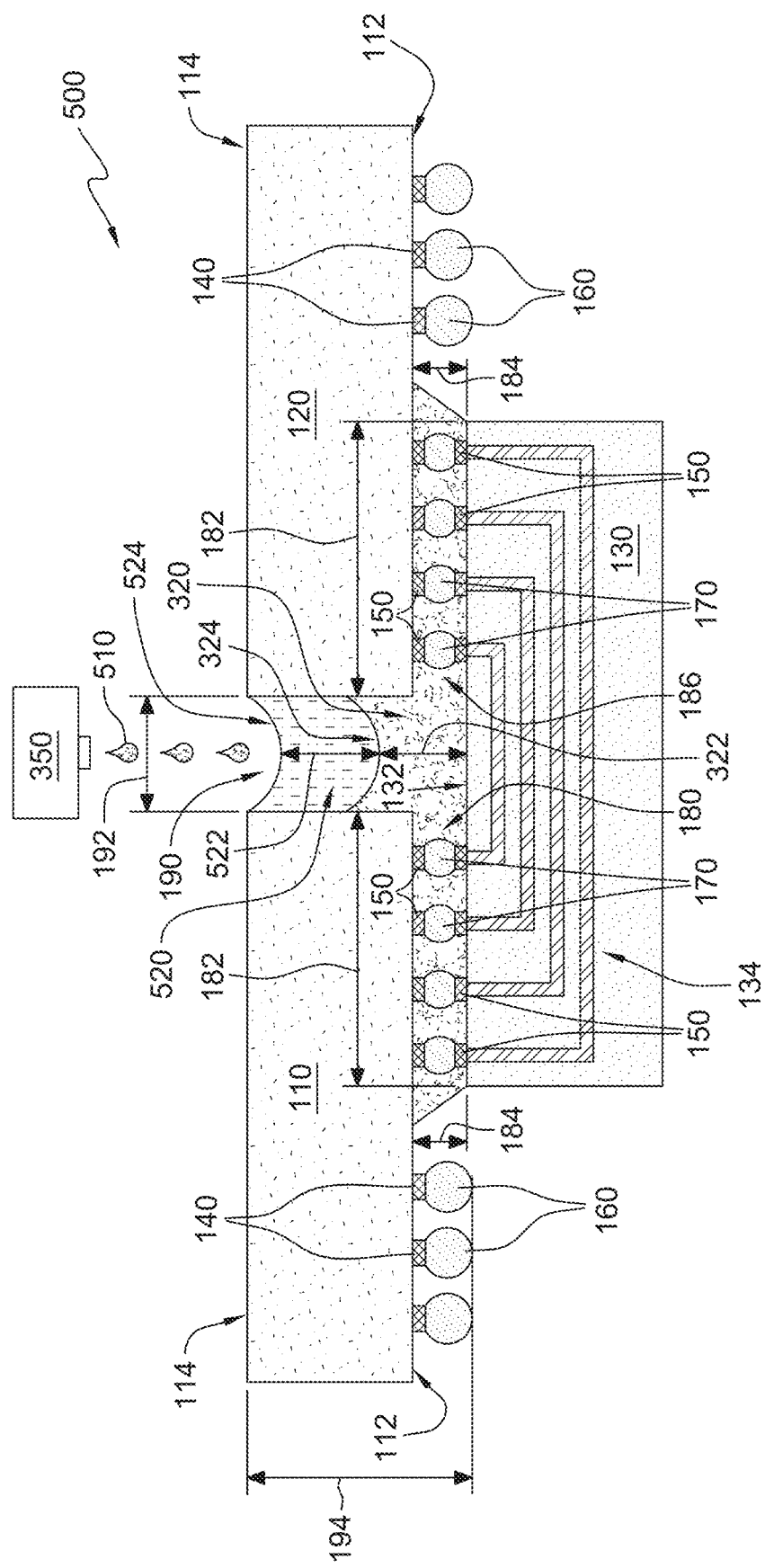
FIG. 5 is a cross-sectional view of interconnected semiconductor subassembly structure 300 after formation of a chip binding layer, generally depicted as interconnected semiconductor subassembly structure, in accordance with at least one embodiment of the present invention.

Referring now to FIG. 5, FIG. 5 is a cross-sectional view of interconnected semiconductor subassembly structure 300 after formation of a chip binding layer 520, generally depicted as interconnected semiconductor subassembly structure 500, in accordance with at least one embodiment of the present invention. As depicted in FIG. 5, chip binding material 510 has been deposited by dispenser 350 within gap 190 and cured to form chip binding layer 520. Specifically, chip binding layer 520 is formed on top surface 324 of underfill layer 320 and partially fills gap 190 between semiconductor dies 110 and 120. In an embodiment, chip binding material 510 deposited within gap 190 self-cures as additional chip binding material 510 is deposited, thus reducing the number of processing steps. In another embodiment, chip binding material 510 only partially cures during the deposition of chip binding material 510 and an additional post-cure processing step is performed. Chip binding material 510 can be any chip binding materials known in the art. In an embodiment, chip binding material 510 is the same material composition as underfill material 310. In another embodiment, chip binding material 510 has a different material composition than underfill material 310.

The amount of chip binding material 510 that is required to be deposited within gap 190 is based, at least in part, on a remaining volume of gap 190 after forming underfill layer 320, plus a particular volume of gap 190 to reach a predetermined height of chip binding layer 520 within gap 190. For example, the height 522 of chip binding layer 520 within gap 190 is precalculated based on a maximum amount of chip binding material 510 that can be dispensed within gap 190 without any excess chip binding material 510 forming on the top surface 114 of semiconductor dies 110 and 120, respectively. This stems from the fact that any chip binding material 510 deposited outside of gap 190 will likely result in contamination of the top surface 114 of semiconductor dies 110 and 120. In an embodiment, and as depicted in FIG. 5, a top surface 524 of chip binding layer 520 formed within gap 190 has a concave meniscus shape. This concave meniscus shape is formed due to the surface tension of chip binding material 510 along the sides of semiconductor dies 110 and 120 that form gap 190.

In an embodiment, the amount of chip binding material 510 dispensed can be controlled based on the dot size of chip binding material 510 dispensed and the number of dots dispensed. It should be appreciated that by forming an additional chip binding layer in chip binding layer 520 on top of underfill layer 320, any future microbump 170 joint stress created during subsequent solder reflow and curing when attaching semiconductor subassembly structure 500 to a package substrate, such as package substrate 710 (depicted in FIG. 7) is further mitigated. This stems from the fact that embodiments of the present invention have demonstrated that as the height of the underfill material and/or chip binding material formed within gap 190 between semiconductor dies 110 and 120 increases, the amount of movement of semiconductor dies 110 and 120 due to temperature fluctuations decreases. Accordingly, as the amount of movement of semiconductor dies 110 and 120 decreases due to temperature fluctuations, so too does any mechanical joint stress on microbumps 170 formed between semiconductor dies 110, 120 and interconnect structure 130.

Figure 6:
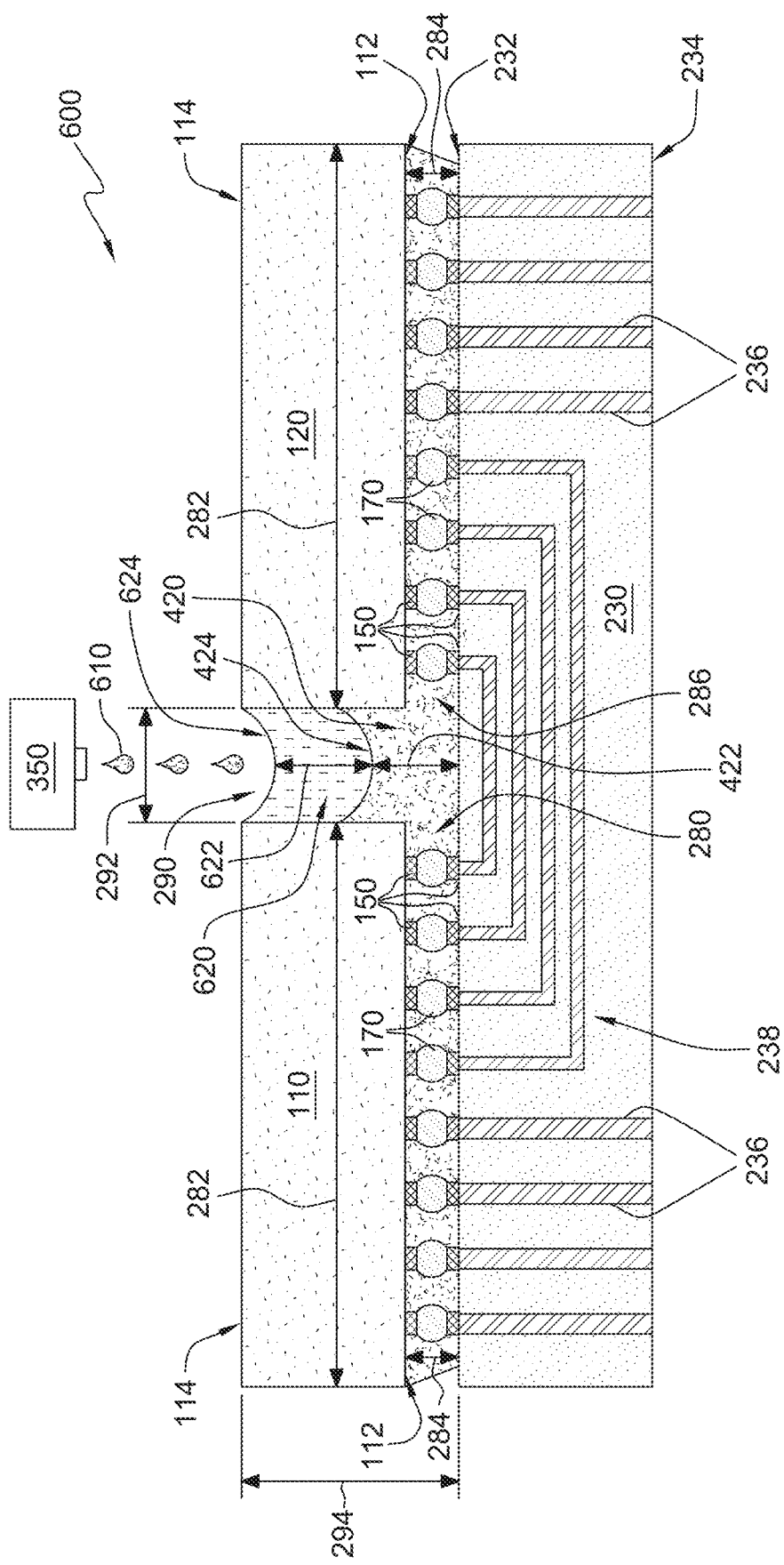
FIG. 6 is a cross-sectional view of interconnected semiconductor subassembly structure after formation of a chip binding layer, generally depicted as interconnected semiconductor subassembly structure, in accordance with at least one embodiment of the present invention.

Referring now to FIG. 6, FIG. 6 is a cross-sectional view of interconnected semiconductor subassembly structure 400 after formation of a chip binding layer 620, generally depicted as interconnected semiconductor subassembly structure 600, in accordance with at least one embodiment of the present invention. As depicted in FIG. 6, chip binding material 610 has been deposited by dispenser 350 within gap 290 and cured to form chip binding layer 620. Specifically, chip binding layer 620 is formed on top surface 424 of underfill layer 420 and partially fills gap 290 between semiconductor dies 110 and 120. In an embodiment, chip binding material 610 deposited within gap 290 self-cures as additional chip binding material 610 is deposited, thus reducing the number of processing steps. In another embodiment, chip binding material 610 only partially cures during the deposition of chip binding material 610 and an additional post-cure processing step is performed. Chip binding material 610 can be any chip binding materials known in the art. In an embodiment, chip binding material 610 is the same material composition as underfill material 410. In another embodiment, chip binding material 610 has a different material composition than underfill material 410.

The amount of chip binding material 610 that is required to be deposited within gap 290 is based, at least in part, on a remaining volume of gap 290 after forming underfill layer 420, plus a particular volume of gap 290 to reach a predetermined height of chip binding layer 620 within gap 290. For example, the height 622 of chip binding layer 620 within gap 290 is precalculated based on a maximum amount of chip binding material 610 that can be dispensed within gap 290 without any excess chip binding material 610 forming on the top surface 114 of semiconductor dies 110 and 120, respectively. This stems from the fact that any chip binding material 610 deposited outside of gap 290 will likely result in contamination of the top surface 114 of semiconductor dies 110 and 120. In an embodiment, and as depicted in FIG. 6, a top surface 624 of chip binding layer 620 formed within gap 290 has a concave meniscus shape. This concave meniscus shape is formed due to the surface tension of chip binding material 610 along the sides of semiconductor dies 110 and 120 that form gap 290.

In an embodiment, the amount of chip binding material 610 dispensed can be controlled based on the dot size of chip binding material 610 dispensed and the number of dots dispensed. It should be appreciated that by forming an additional chip binding layer in chip binding layer 620 on top of underfill layer 420, any future microbump 170 joint stress created during subsequent solder reflow and curing when attaching semiconductor subassembly structure 600 to a package substrate, such as package substrate 810 (depicted in FIG. 8) is further mitigated. This stems from the fact that embodiments of the present invention have demonstrated that as the height of the underfill material formed within gap 290 between semiconductor dies 110 and 120 increases, the amount of movement of semiconductor dies 110 and 120 due to temperature fluctuations decreases. Accordingly, as the amount of movement of semiconductor dies 110 and 120 decreases due to temperature fluctuations, so too does any mechanical joint stress on microbumps 170 formed between semiconductor dies 110, 120 and interconnect structure 230.

Figure 7:
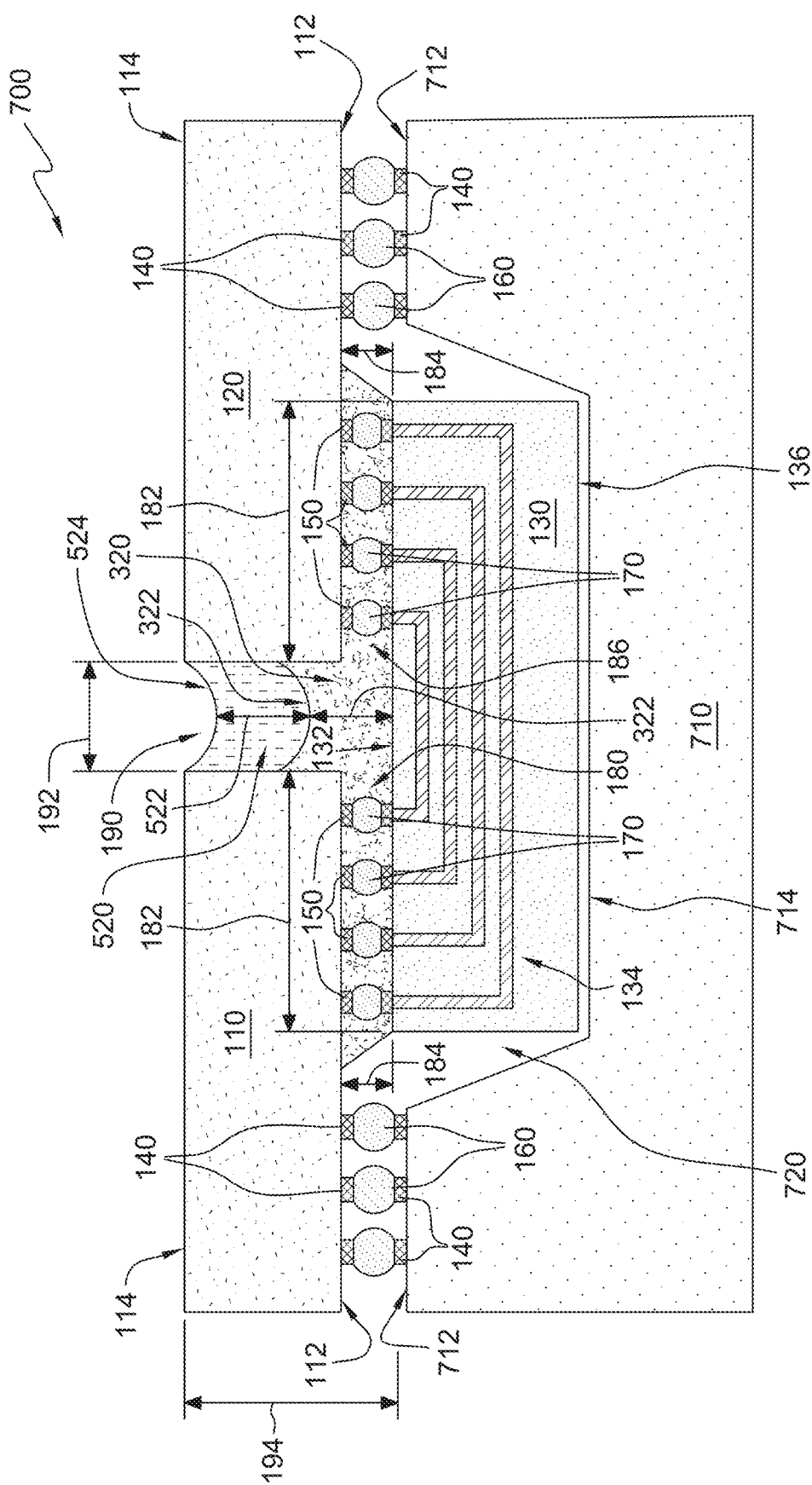
FIG. 7 is a cross-sectional view of interconnected semiconductor subassembly structure attached to a package substrate, generally depicted as interconnected semiconductor structure, in accordance with at least one embodiment of the present invention.

Referring now to FIG. 7. FIG. 7 is a cross-sectional view of interconnected semiconductor subassembly structure 500 attached to a package substrate 710, generally depicted as interconnected semiconductor structure 700, in accordance with at least one embodiment of the present invention. Package substrate 710 can be made from any generally known substrates. For example, package substrate 710 can be an organic laminate substrate formed from organic materials such as organic resin and epoxy resin. In another example, package substrate 710 can be an inorganic substrate formed from inorganic materials such as glass or ceramic. In yet another example, package substate 710 can be a composite material formed from a combination of organic and inorganic materials.

Prior to forming semiconductor structure 700 as depicted in FIG. 7, a portion of package substrate 710 was removed to form an opening 720 in package substrate 710 and bonding pads 140 were formed on portions of top surface 712 of package substrate 710. As depicted in FIG. 7, the height of the opening formed in package substate 710 is greater than the height of interconnect structure 130 such that interconnect structure 130 is completely embedded within package substrate 710 while still leaving a small gap between bottom surface 136 of interconnect structure 130 and surface 714 of package substrate 710. However, in an alternate embodiment, the height of opening 720 formed in package substrate 710 may be equal to the height of interconnect structure 130 such that interconnect structure 130 is completely embedded within package substrate 710 with no gap between bottom surface 136 of interconnect structure 130 and surface 714 of package substrate 710. In yet another alternative embodiment, the height of the opening formed in package substrate 710 is less than the height of interconnect structure 130 such that interconnect structure 130 is partially embedded within opening 720 of package substrate 710 such that an upper portion of interconnect structure 130 is above top surface 712 of package substrate 710.

After bonding pads 140 were formed on portions of top surface 712 of package substrate 710, solder bumps 160 located on bottom surface 112 of semiconductor dies 110 and 120 were lined up with and attached to corresponding bonding pads 140 located on top side 712 of package substrate 710 as depicted in FIG. 7. The attachment of subassembly structure 600 to package substrate 710 can be completed by heating semiconductor structure 700, which results in the reflow of solder bumps 160, followed by a subsequent cooling period. After the cooling of semiconductor structure 700, a solder bond or solder joint is formed between solder bumps 160 and bonding pads 140 located on bottom surface 136 of interconnect structure 130 and top surface 712 of package substate 710. In an embodiment, formic acid reflow of solder bumps 160 can be performed if flux is not used in the soldering process.

It should be appreciated that by forming underfill layer 320 and chip binding layer 520 within gap 190 prior to bonding interconnected semiconductor subassembly structure 500 to package substrate 710 to form interconnected semiconductor structure 700, interconnected semiconductor structure 500 is able to be bonded to package substrate 710 without the need for any atmospheric plasma bonding processes. It should be further be appreciated that as compared to interconnected semiconductor structure 700 formed without any underfill layer and/or chip binding layer between semiconductor dies 110 and 120, interconnected semiconductor structure 700 as depicted in FIG. 7 underwent significantly less chip movement during temperature cycling. For example, during temperature cycling from 100° C. to −50° C., interconnected semiconductor structure 700 without any underfill layer formed between semiconductor dies 110 and 120 had a change in thermal shrinkage of 3.9 um, while interconnected semiconductor structure 700 as depicted in FIG. 7 had a change in thermal shrinkage of only 0.7 um.

Figure 8:
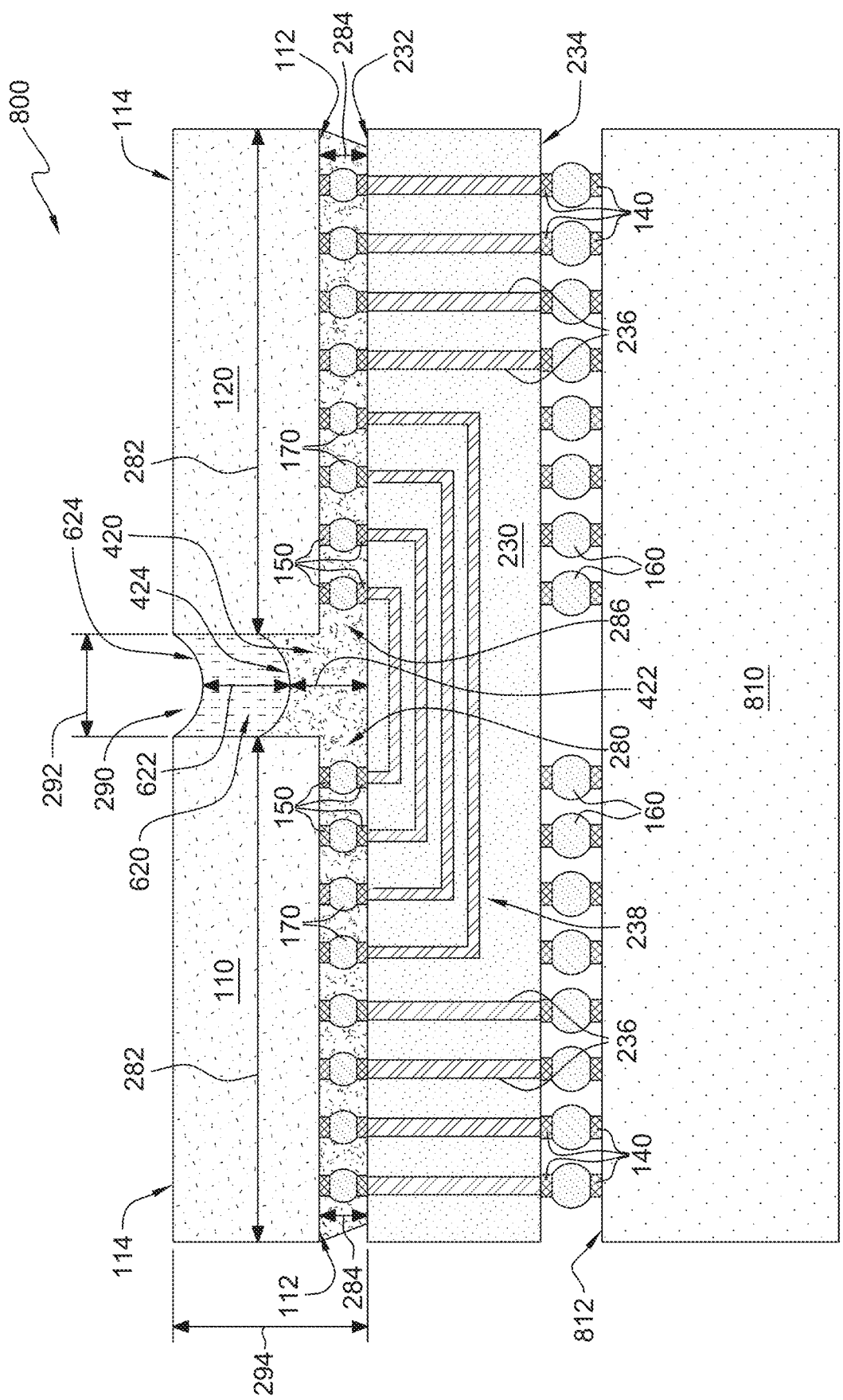
FIG. 8 is a cross-sectional view of interconnected semiconductor subassembly structure attached to a package substrate, generally depicted as interconnected semiconductor structure, in accordance with at least one embodiment of the present invention.

Referring now to FIG. 8, FIG. 8 is a cross-sectional view of interconnected semiconductor subassembly structure 600 attached to a package substrate 810, generally depicted as interconnected semiconductor structure 800, in accordance with at least one embodiment of the present invention. Package substrate 810 can be made from any generally known substrates. For example, package substrate 810 can be an organic laminate substrate formed from organic materials such as organic resin and epoxy resin. In another example, package substrate 810 can be an inorganic substrate formed from inorganic materials such as glass or ceramic. In yet another example, package substate 810 can be a composite material formed from a combination of organic and inorganic materials.

Prior to forming semiconductor structure 800 as depicted in FIG. 8, bonding pads 140 were initially formed on portions of what is now depicted as bottom side 234 of interconnect structure 230 and top side of 812 of package substrate 810. Solder bumps 160 were thereafter formed on top of bonding pads 140 located on bottom surface 234 of interconnect structure 230. After solder bumps 160 were formed on top of bonding pads 140 located on bottom surface 234 of interconnect structure 230, subassembly structure 600 was flipped over or turned upside down, and solder bumps 160 were lined up with and attached to corresponding bonding pads 140 located on top side 812 of package substrate 810 as depicted in FIG. 8. The attachment of subassembly structure 600 to package substrate 810 can be completed by heating semiconductor structure 800, which results in the reflow of solder bumps 160, followed by a subsequent cooling period. After the cooling of semiconductor structure 800, a solder bond or solder joint is formed between solder bumps 160 and bonding pads 140 located on bottom surface 234 of interconnect structure 230 and top surface of package substate 812. In an embodiment, formic acid reflow of solder bumps 160 can be performed if flux is not used in the soldering process.

Figure 13:
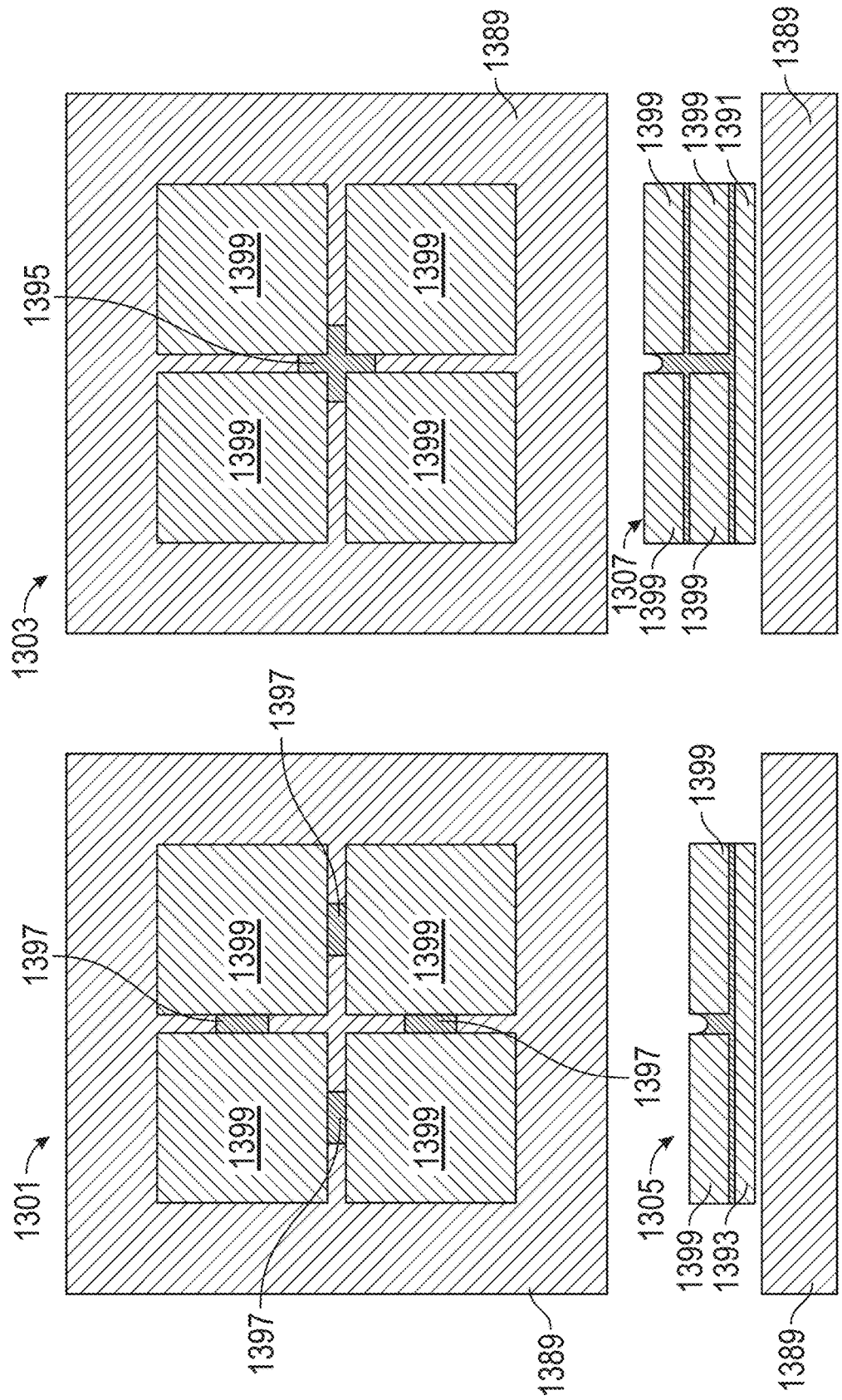
FIG. 13 shows additional structural embodiments of fine jet underfill dispensing in accordance with aspects of the present invention.

FIG. 13 shows additional structural embodiments of fine jet underfill dispensing in accordance with aspects of the present invention. View 1301 shows multiple chips 1399 and multiple small bridges 1397. View 1303 shows multiple chips 1399 and one small bridge 1395. View 1305 shows multiple chips 1399 and one large bridge 1393 (the large bridge can be, for example, a silicon interposer, redistribution layer (RDL), etc.). View 1307 shows multiple stacked chips 1399 and one large bridge 1391 (the large bridge can be, for example, a silicon interposer, RDL, etc.). Because the structures 1305, 1307 do not have a "small bridge" structure, but rather have a (large) bridging structure at the bottom layer 1393, 1391, the jetted underfill can be filled into the bump layer under each stacked chip through the gap between the top dies even without any peripheral space for underfill dispense. Note the package substrate 1389 in each case.

In one or more embodiments, jet material for fine dot(s) has a relatively lower viscosity in contrast to a pre-bind resin for the gap between chips, which can be of a higher viscosity (e.g., high silica-filler content) than standard underfills. This is due to having a larger gap than bump area. The skilled artisan is familiar with various resins/underfills, and the terms "low" and "high" viscosity have meaning to the skilled artisan in the context of such materials for uses as described herein.

In another aspect, to enhance wicking (i.e., flow by capillary action) of underfill, studs are fabricated on a bridge chip (and/or on one or more of the large chips). For example, studs are formed on bridge chips and contact the edge of the large chip(s), or the top surface of the stud is located in between the large chip gap after bridge chip bonding, so that the studs can contact the underfill meniscus in the trench during the underfill dispensing process. Stud(s) can be fabricated, for example, by an electroplating process (e.g., copper (Cu) pillar or the like), wire bonding (e.g., Cu or gold (Au) stud bump), patternable resin, high viscosity resin, and so on. In at least some cases, stud(s) can be dummy bumps which are not connected electrically, but which contact the underfill meniscus physically during the underfill dispensing process. In one or more embodiments, the gap between the bridge chip and the large chips is smaller than the gap between the large chips. Optionally, a cavity is fabricated on the back side of chip(s) for underfill (UF) dispense.

Consider a non-limiting exemplary process flow for the case where the studs can be formed on the bridge. For the bridge chip, carry out micro bump fabrication on the bridge chip wafer and stud fabrication on bridge chip wafer (e.g., dummy bump, additional plating, Cu or Au wire stud bump by wire bonding, permanent resin, and the like). This can be skipped if a dummy bump is employed; refer to the discussion of FIG. 9I. Dice the bridge chip wafer. Carry out stud fabrication on the bridge by high viscosity resin, in case that technique is being employed. For the large chip (e.g., a processor chip), optionally, carry out cavity formation for the UF dispensing cavity (e.g., via laser, machining, etching, or the like). Dice the wafer on which the large chips are being fabricated. Carry out assembly by, for example, joining the bridge chip onto the processor (or other large) chips (e.g., via formic acid reflow with a fixture), and plasma treatment. Dispense capillary underfill (CUF) (for example, to fill the large chip-large chip gap and the bridge-large chip gaps) and cure.

Advantageously, in embodiments employing studs, CUF can be used instead of non-conductive paste (NCP) bonding to improve reliability, even with smaller gaps between chips. Standard capillary underfill dispensing can be used instead of jet dispensing method, obviating the need to install a jet dispenser. Furthermore, one or more embodiments employing studs can be applied to a smaller gap between top chips (e.g., less than 150 μm); under such conditions, the jet dispensing method may encounter difficulty in producing small drop less than the gap width. Even further, one or more embodiments employing studs provide a more rigid subassembly because UF exists in bridge—LC (large chip) gap and the LC—LC gap; also, the optional cavity on the chip back side can enable stable CUF dispensing.

The stud height, shape, and/or location can be varied and formed by several methods. In one or more embodiments, a part of the upper surface of the stud(s) is positioned in the trench, or the studs contact the edge of the LC (or trench), so that the stud can contact the underfill meniscus in the trench. In one or more embodiments, the gap between the bridge and the large chip is less than the gap between the large chips, to facilitate flow of underfill by capillary action from the large chip to large chip gap into the large chip to bridge gap.

Figure 9A:
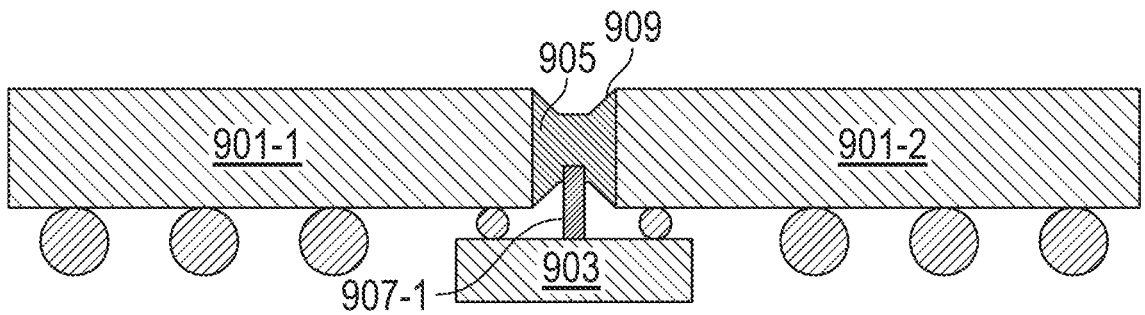
FIGS. 9A-9L, 10A-10D, 11A-11E, and 12 show aspects of bridge underfilling with studs, and related cavity structures, in accordance with at least one embodiment of the present invention.
Figure 9B:
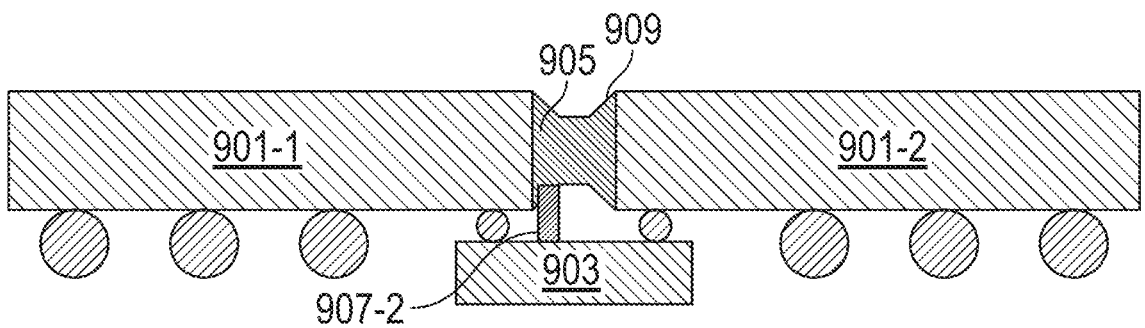
Figure 9C:
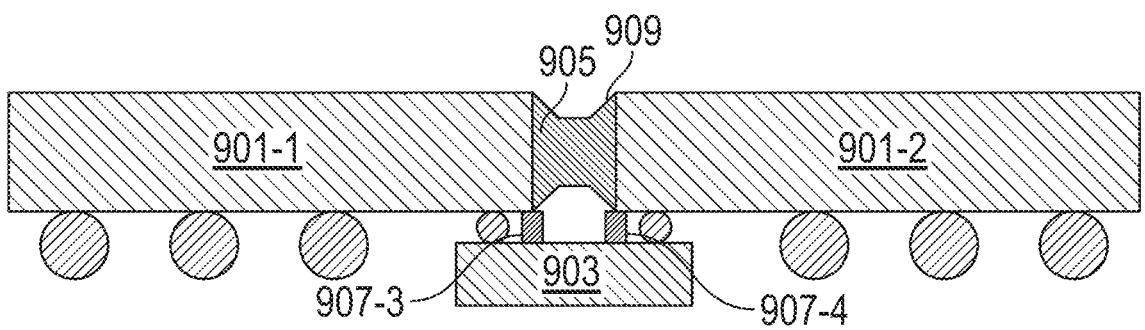
Figure 9D:
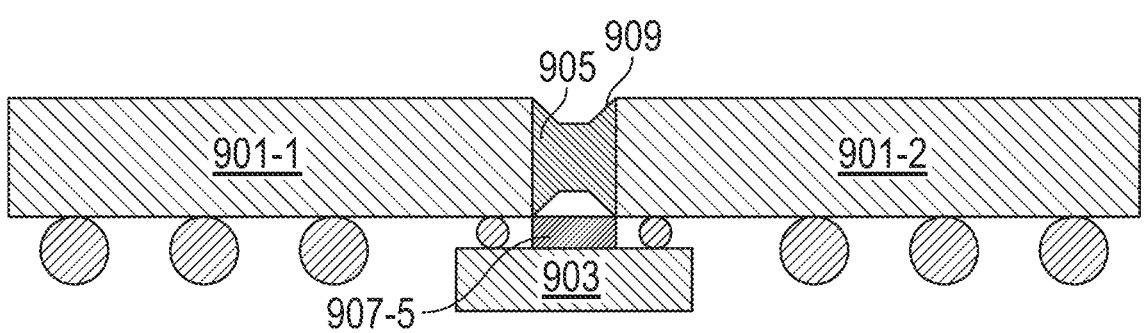

FIGS. 9A-9D show exemplary intermediate process steps. Note the large chips 901-1, 901-2; bridge chip 903; underfill material 905; and studs 907-1, 907-2, 907-3, 907-4, and 907-5. Solder bumps and micro bumps similar to solder bumps 160 and micro bumps 170 as discussed above, or other suitable structures, can be employed in one or more embodiments, and are not separately numbered, to avoid clutter. Note in each case the underfill meniscus 909. In FIG. 9A the stud 907-1 is in the large chip to large chip gap, not touching either large chip 901-1 or 901-2 (e.g., centered in the gap). In FIG. 9B the stud 907-2 is touching the large chip 901-1. In FIG. 9C, two studs 907-3 and 907-4 are employed, each touching an edge of the respective large chip 901-1, 901-2. In this case, the studs could be formed, for example, on the large chips instead of the bridge. FIG. 9D shows an alternative configuration of stud 907-5, discuss in greater detail with regard to FIG. 9J below.

Figure 9E:
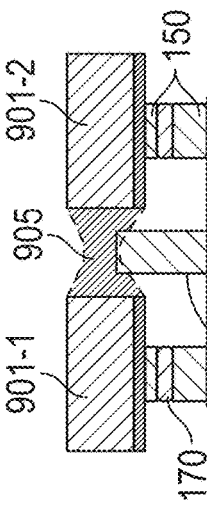
Figure 9F:
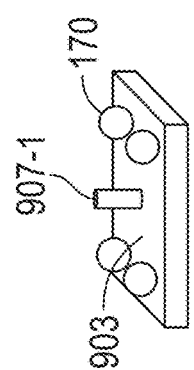

FIG. 9E shows a cross-sectional view including the large chips 901-1, 901-2 and the trench 911 (i.e., the gap between the larger chips). FIG. 9F shows a bridge chip 903 with stud 907-1 and microbumps 170, only one of which is numbered to avoid clutter. FIG. 9G shows a bridge chip 903 with a stud in the form of an electroplated bump 907-6. Note the two large chips 901-1, 901-2; underfill material 905; bonding pads 150 and microbumps 170. FIG. 9H shows a structure similar to that of FIG. 9G but with a stud in the form of a stud bump 907-7 made, for example, by a wire bonder (suitable materials include Cu, Au, and the like). FIG. 9I shows a structure similar to that of FIGS. 9G and 9H but with two studs 907-8, 907-9 in the form of dummy bumps with no electrical connections (studs 907-8, 907-9 are non-limiting examples of implementations of studs 907-3 and 907-4). Each dummy bump 907-8, 907-9 includes a bonding pad such as 150 (not separately numbered to avoid clutter) on the bridge chip 903 and a microbump such as 170 (not separately numbered to avoid clutter) on the bonding pad; there is no corresponding bonding pad on the large chips 901-1, 901-2 and so no electrical connection.

Figure 9J:
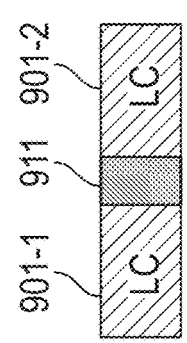
Figure 9H:
Figure 9H:
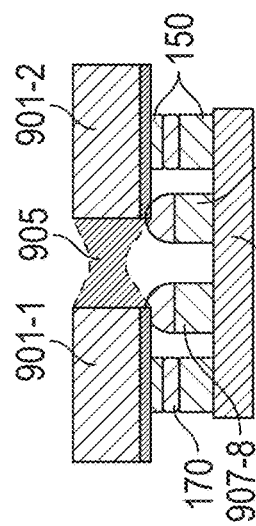
Figure 9I:
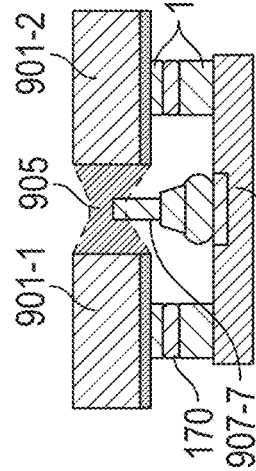
Figure 9G:
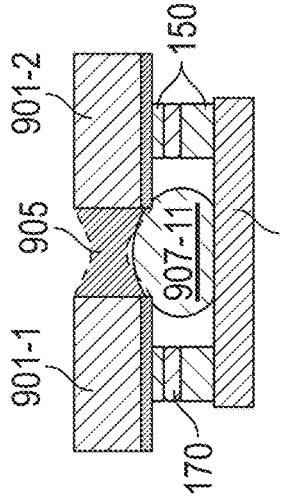
Figure 9K:
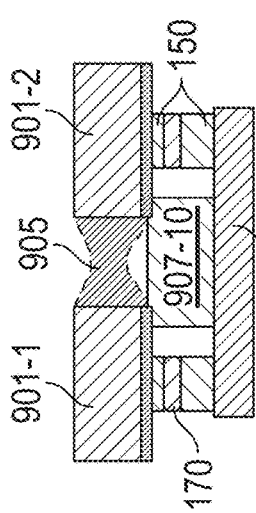
Figure 9L:
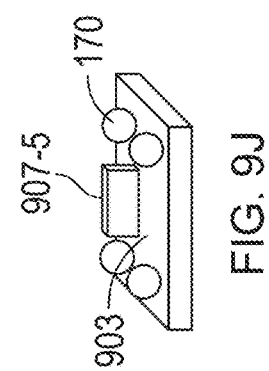

FIG. 9J shows a bridge chip 903 with stud 907-5 and microbumps 170, only one of which is numbered to avoid clutter. The stud 907-5 is in the form of a rectangular prism laid on its edge. FIG. 9K shows a structure similar to that of FIGS. 9G, 9H and 9I but with a rectangular prismatic stud 907-10 formed using a photo-patternable resin/adhesive (stud 907-10 is a non-limiting example of an implementation of stud 907-5). FIG. 9L shows a structure similar to that of FIGS. 9G, 9H, 9I and 9K but with a stud 907-11 formed using high viscosity resin (e.g., in the form of a dam).

Figure 10A:
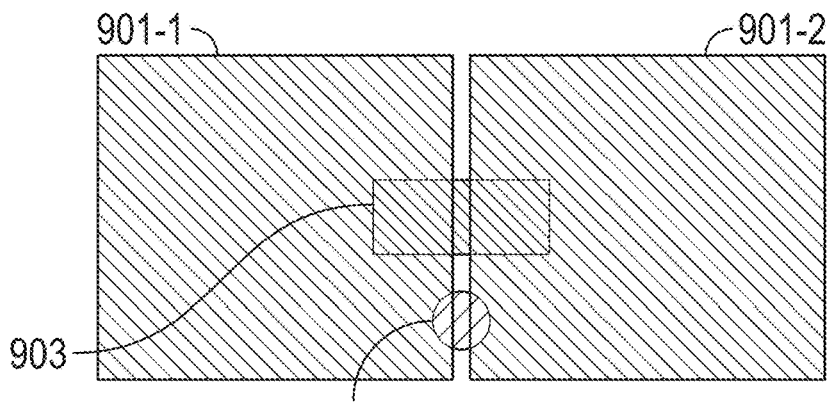
Figure 10B:
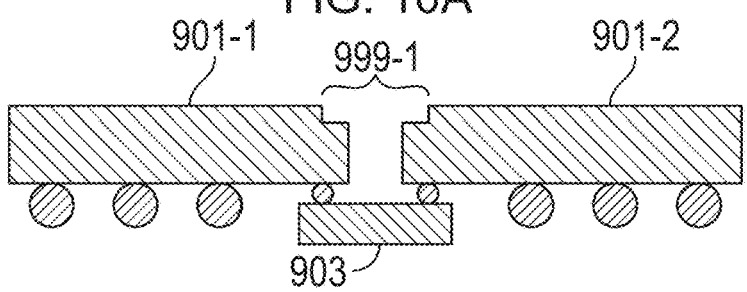
Figure 10C:
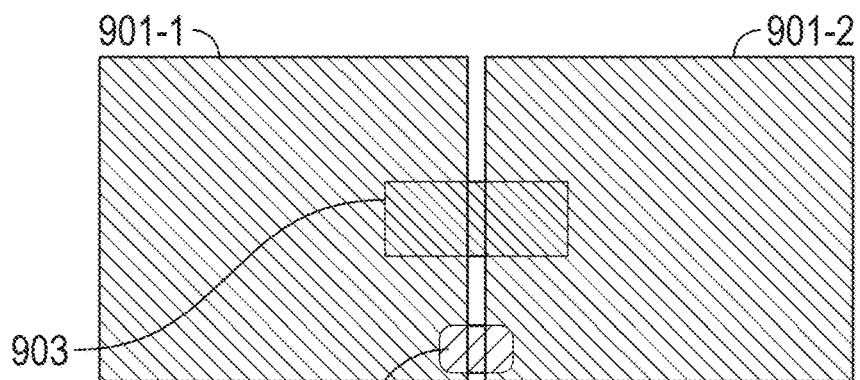
Figure 10D:
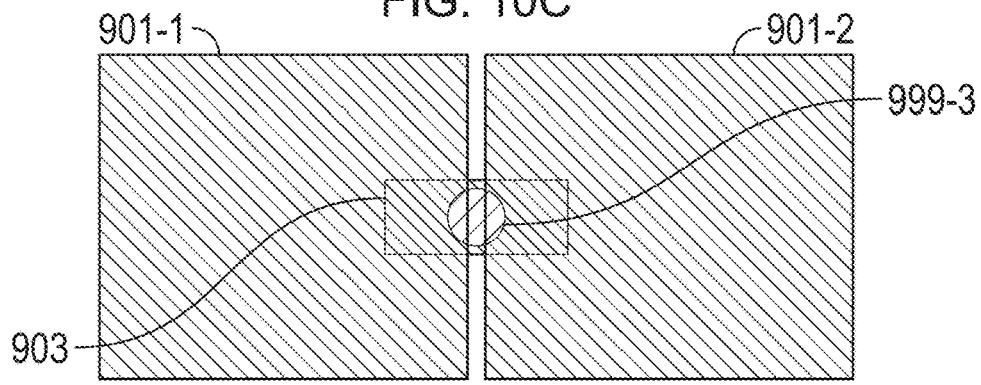

FIGS. 10A-10D show aspects of an optional cavity structure; elements similar to those in other figures have received the same reference characters. FIGS. 10A and 10B show top and side views of a first approach with a circular cavity 999-1 which is formed on the back sides (sides opposite the bridge chip) of the two large (e.g., silicon) chips 901-1, 901-2; in the example of FIGS. 10A and 10B, a semicircular portion of the circular reservoir is formed in each chip 901-1, 901-2 and the reservoir is offset from the bridge chip. In FIG. 10B, note solder bumps such as 160 and microbumps such as 170, not separately numbered to avoid clutter. FIG. 10C is a top view with an alternative cavity 999-2 having an oblong shape, half of which is formed in each of the two large (e.g., silicon) chips 901-1, 901-2; cavity 999-2, like cavity 999-1 is offset from the bridge chip. FIG. 10D is a top view with another alternative cavity 999-3 having a circular shape like that of cavity 999-1; cavity 999-3 is located over the bridge chip.

We have found that one or more embodiments using one or more studs with CUF provide better reliability than NCP (generally, the K1C/G1C of CUF is greater than those of NCP) and/or a more rigid sub-assembly than other methods (for example, CUF advantageously fills all the gaps of the sub-assembly, i.e., gap(s) between the bridge and the large chips and between the large chips). One or more embodiments are helpful, for example, in improving implementations of direct bonded heterogeneous integration (DBHi) silicon bridges.

In one or more embodiments, CUF can be used instead of NCP for reliability improvement, even with a smaller gap between chips. Furthermore, in one or more embodiments employing studs, standard CUF dispensing can be used instead of the jet dispensing method, advantageously obviating the need to install a jet dispenser. Indeed, one or more embodiments employing studs can be applied to smaller gaps between the top (large) chips (e.g., less than 150 pm) where the jet dispensing method may encounter difficulty in producing small drops less than the gap width. The optional cavity on the chip back side can enable stable CUF dispensing.

It is worth noting that in one or more embodiments, the cavity 999-1, 999-2, 999-3 is formed on the back side of the large (e.g., silicon) chips 901-1, 901-2; furthermore, one or more embodiments do not utilize a removable reservoir body but rather use a reservoir formed directly as a cavity in the chip back side(s).

Still referring to FIGS. 10A-10D, the cavity size, shape, and location can be varied. In a non-limiting example, employ a 25G (gauge number of 25) needle with an outer diameter of 0.51 mm, and an inner diameter of 0.29 mm. The diameter of cavities 999-1, 999-3 can be, for example, greater than 0.6 mm, by taking into account the alignment accuracy of the dispenser (say, plus or minus 25 μm). In a non-limiting example, with a 1.0 mm diameter cavity, the cavity area is about 0.1% of the total die area, with a large chip size of 19 mm square.

FIGS. 11A-11E show an exemplary bridge fill process flow, according to an aspect of the invention. We have found that CUF will improve TC (temperature cycling) reliability of DBHi packages, and that jet dispensing is a good method for, for example, a gap greater than or equal to 150 μm between the large chips. One or more embodiments employing studs enable CUF of the bridge chip for a smaller gap (i.e., gap between the large chips of less than 150 μm) without the need to use a jet dispenser.

Figure 11A:
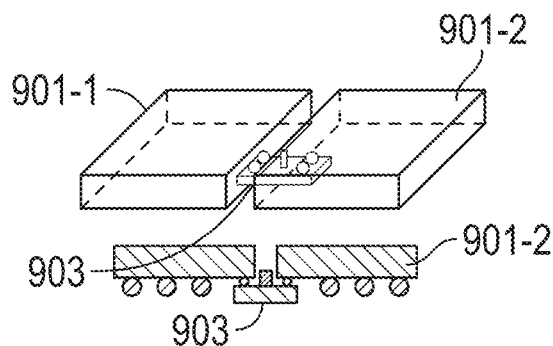
Figure 11B:
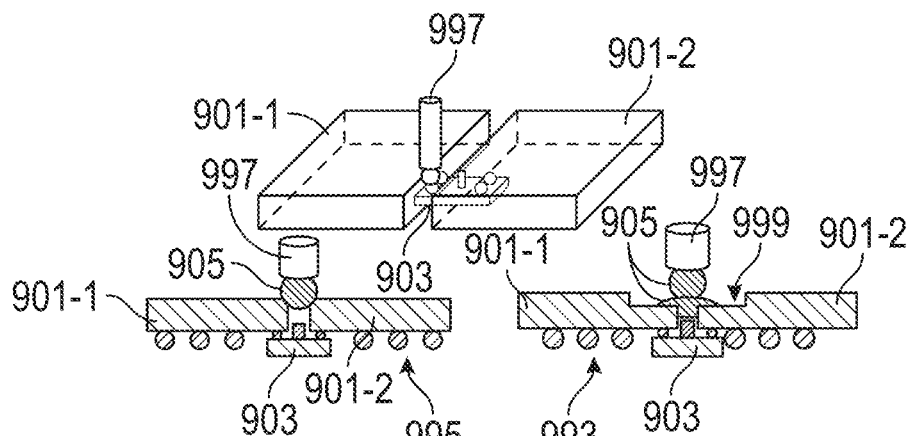
Figure 11C:
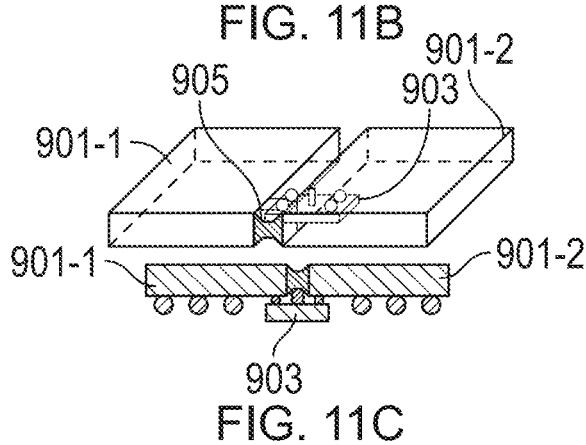
Figure 11D:
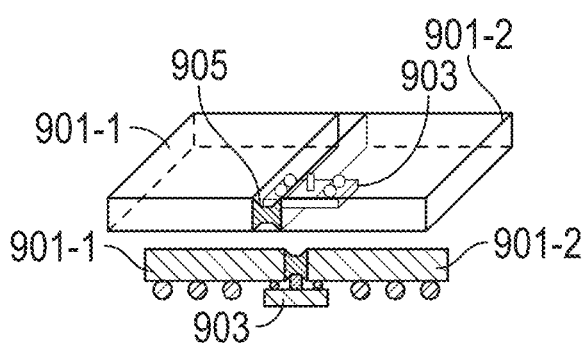
Figure 11E:
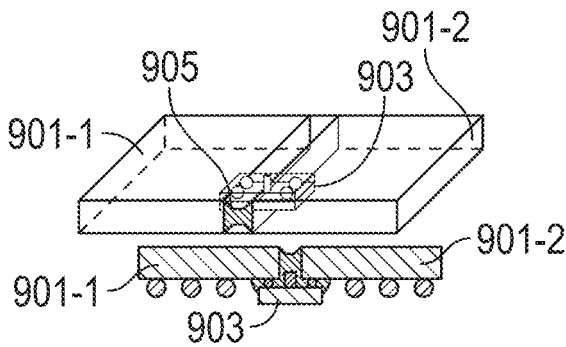

Start with a bridge chip with micro bumps and a stud, as shown in FIG. 9F. In FIG. 11A, assemble the two large chips 901-1, 901-2 to the bridge 903 of FIG. 9F; for example, using formic acid reflow. Note that each of FIGS. 11A-11E includes both pictorial and cross-sectional views (two cross-sectional views in the case of FIG. 11B). As shown in FIG. 11B, use a needle 997 to apply capillary underfill 905 directly between the large chips as in view 995 or in the reservoir 999 formed on chip backside as in view 993. Reservoir 999 is generally representative of any configuration of cavity. In FIG. 11C, underfill 905 flows from directly between the large chips or from the reservoir, as the case may be, through the gap between the two large chips 901-1, 901-2 (also referred to as a trench) to the bridge area. In FIG. 11D, sufficient underfill 905 flows to touch the stud(s). In FIG. 11E, underfill 905 flows into the gap between the large chips and the bridge chip from the trench.

Figure 12:
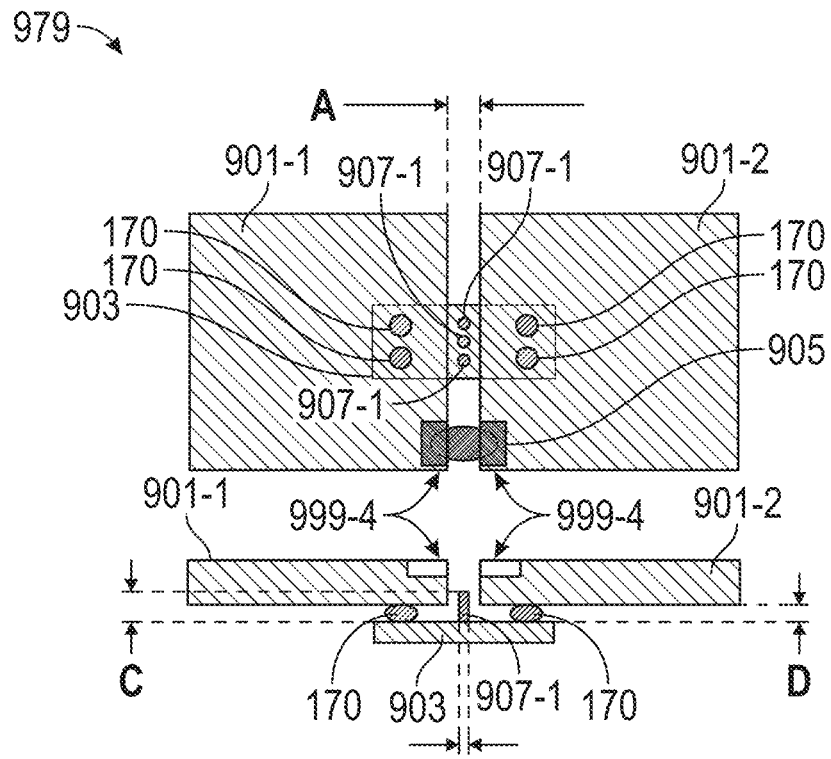
Figure 12:
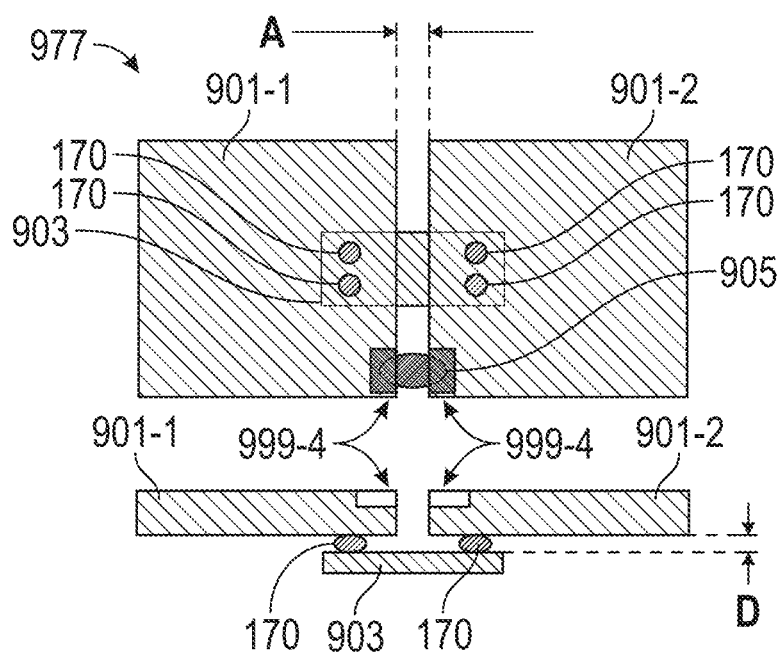

Referring to FIG. 12, we performed tests to evaluate the effect of studs formed on the bridge chip. The left-hand sample 979 included three studs, while the right-hand sample 977 had no studs. The stud height C was ~35 μm so that the top surface of the stud could be located between the large chips 901-1, 901-2. For both samples, the large chips were approximately 19 mm square, the large chip to large chip distance A was about 80 the bridge chip was about 2.5 by 6 mm, and the large chip to bridge chip distance D was about 20 The stud diameter E was about 40 μm and the stud pitch was 80 Once CUF in the trench (the gap between the large chips) contacts and wets the studs, CUF flows downward through the studs and spreads on the bridge chip surface. Capillary force due to the gap between studs (in case of the number of studs being more than one) helps CUF to flow downward. Capillary force due to the gap between the large chip and the bridge chip (20 μm in this case) is higher than that due to the gap between the large chips (80 μm in this case); therefore, it can drag CUF into the gap between the large chip and the bridge chip from the trench. CUF flows due to capillary force, and we noted in tests that a CUF fillet around the bridge chip was well formed without spreading further on the large chip surface. Without studs, it is difficult for CUF to flow downward and fill the gap between the large chip and the bridge chip (this refers to the pre-bind case as discussed herein).

Given the teachings herein, the skilled artisan will be able to adapt known fixturing techniques to assemble one or more embodiments and/or sub-assemblies thereof; for example, as set forth in co-assigned U.S. Pat. No. 10,833,051 of ARVIN, CHARLES L., et al., PRECISION ALIGNMENT OF MULTI-CHIP HIGH DENSITY INTERCONNECTS.

Figure 14A:
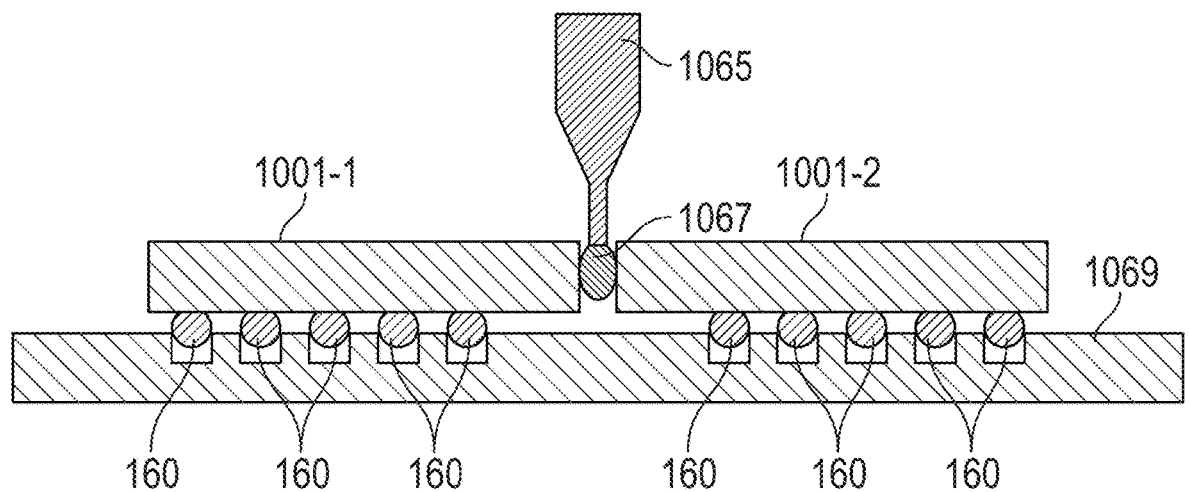
Figure 14B:
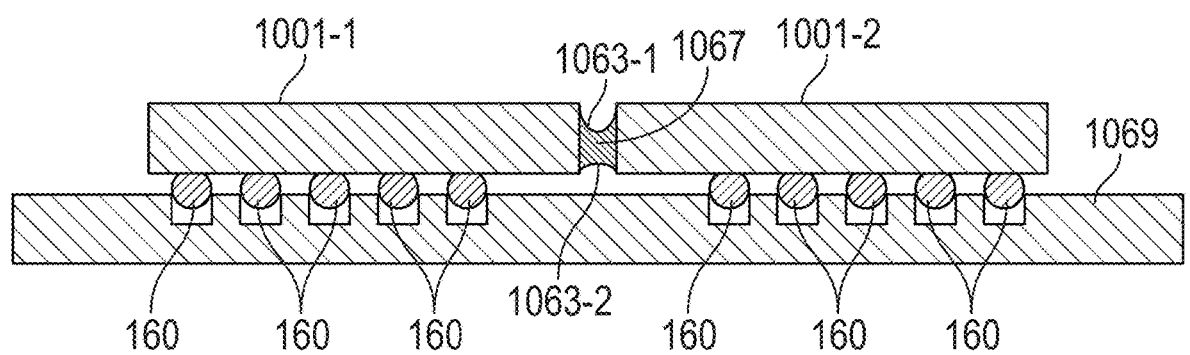
Figure 14C:
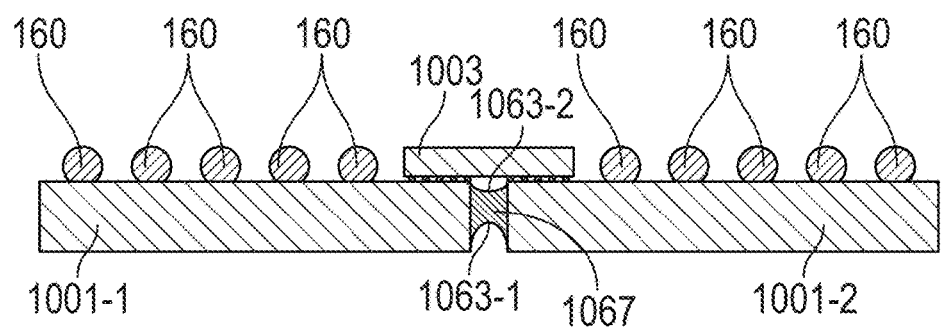

Another aspect of the invention relates to pre-binding chip assembly technology. Since "bond" is often used as a terminology related to a metal bump joining step, the terminology pre-binding (as opposed to pre-bonding) is used herein to refer to "adhering" by using pre-binding as described herein. Consider, for example, a pre-bound multi-chip structure with capillary-filled resin between the chip edges. In this aspect, carry out NCP dispense on micron pads of the large (e.g., processor chip(s)). Undertake thermal compression bonding of the bridge chip to the processor chip(s). Implement post cure for the NCP. Join the laminate and carry out underfilling. Referring to FIG. 14A, place the large (e.g., processor) chips 1001-1, 1001-2, analogous to chips 901-1, 901-2, on a carrier 1069 (e.g., silicon). Fixture 1069 includes recesses (not separately numbered) that receive solder bumps 160 on chips 1001-1, 1001-2. Dispense pre-bind resin 1067 into the gap between chips 1001-1, 1001-2, using a suitable dispenser 1065. Cure the resin then bond the bridge chip. FIG. 14B shows the resin 1067 having flowed into the gap between chips by capillary action with a meniscus 1063-1, 1063-2 on the top and bottom of the resin; the resin is then cured. FIG. 14C shows the chips 1001-1, 1001-2 after removal from the fixture 1069, being flipped over, and bonding of the bridge 1003 via microbumps 170 (not numbered in FIG. 14C).

Figure 14D:
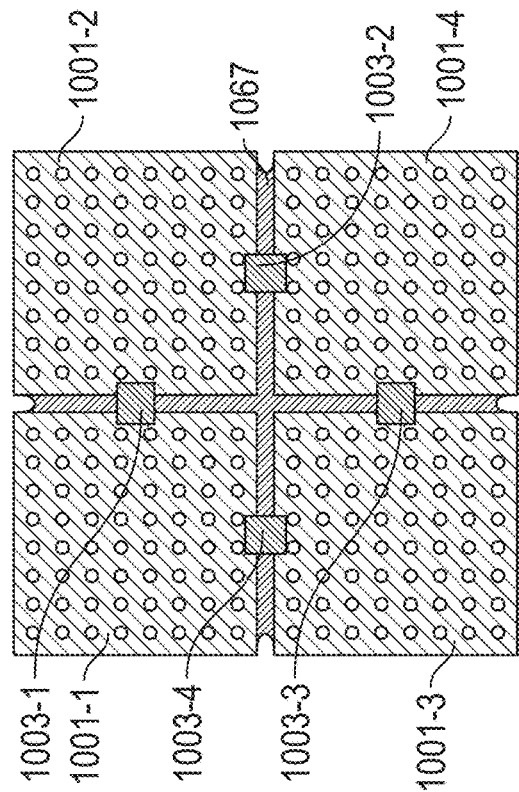
Figure 14E:
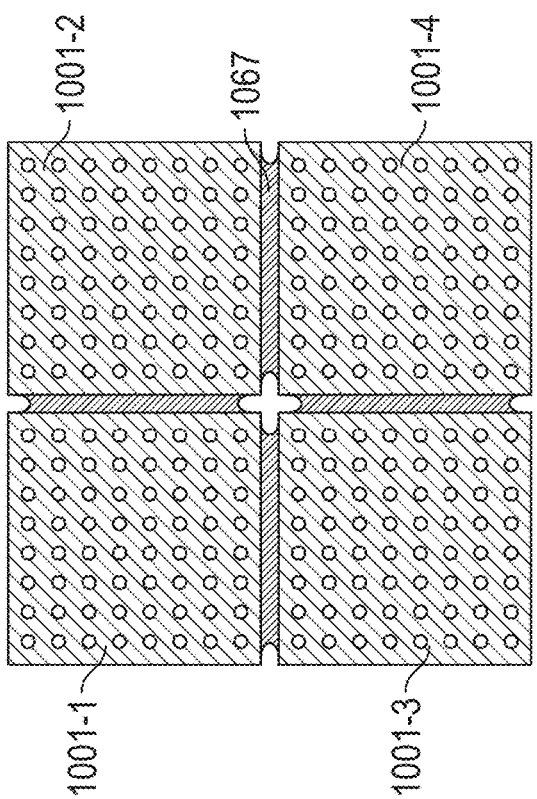
Figure 14F:
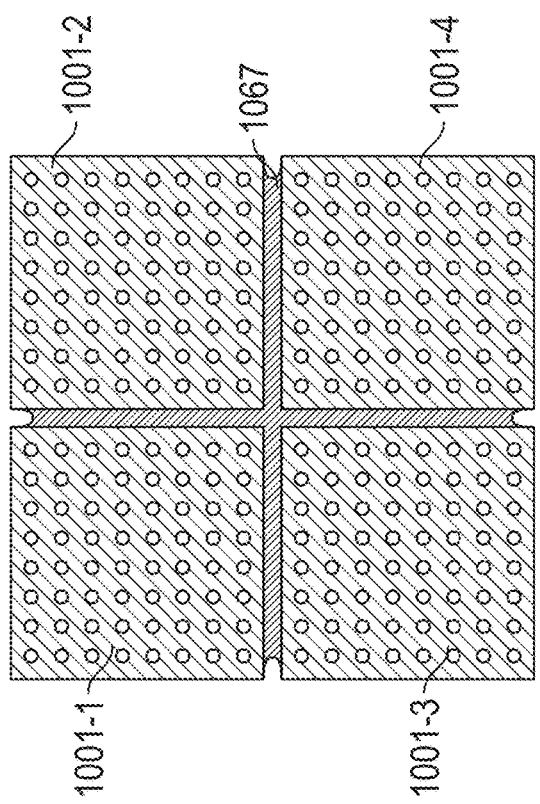
Figure 14G:
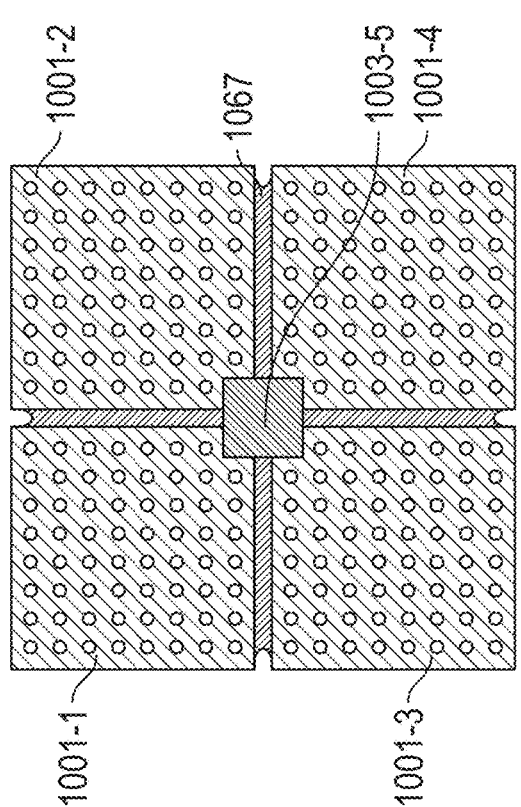

This exemplary assembly process enables simplification of the bonding and assembly process. In one or more embodiments, the pre-bound structure reduces the stress on micro joints of the bridge chip and enables usage of finer pitch bumps for high bandwidth interconnection. Furthermore, in one or more embodiments, the pre-binding enables use of a thinner bridge to eliminate a cavity structure in the substrate. This structure enables, for example, expansion of a DBHi silicon bridge package structure from two chips to many chips. FIGS. 14D, 14E, 14F, and 14G show exemplary four-chip package structures. The four large chips are designated as 1001-1, 1001-2, 1001-3, 1001-4; note the pre-bind resin 1067 in the gaps between the chips 1001-1, 1001-2, 1001-3, 1001-4. FIG. 14D shows four chips without a bridge; FIG. 14E shows four chips with four bridges 1003-1, 1003-2, 1003-3, 1003-4, each spanning two of the four chips; and FIG. 14F shows four chips with a single bridge 1003-5 coupling all four chips. FIG. 14G shows a case where dispensing is carried out for each gap separately. FIGS. 14D, 14E, 14F and 14G are thus examples of pre-bound quad chip sub-assemblies (e.g., DBHi). The chips can be, for example, 20 mm square.

FIGS. 15A and 15B illustrate aspects of capillary force estimation, applicable to several embodiments of the invention. Purely for illustrative purposes, an example will be given in the context of a pre-bind resin such as standard capillary underfill. This exemplary pre-bind resin material has a surface tension $\gamma_{LG}$=35 mN/m=0.035 N/m; a specific gravity $\rho g$=1.6 g/cm$^3$×g=1600 kg/m$^3$×g=15,680 N/m$^3$ ("$\rho$" is the mass density in g/cm$^3$ or kg/m$^3$ and "g" is the acceleration due to Earth's gravity, approximately 9.8 m/s$^2$ in SI units); and an estimated contact angle $\theta$=10 degrees).

FIG. 15A shows the height h of liquid between two plates spaced apart by a distance d in terms of the contact angle, surface tension, and specific gravity. The capillary force for various gaps can be estimated as follows, in terms of the height of the wicked liquid (wicking refers to flow induced by capillary action):

Gap $d$=150 μm=0.00015 m: $h$=2×0.035×cos(10)/15680/0.00015=0.0293 m=29.2 mm

Gap $d$=300 μm=0.0003 m: $h$=2×0.035×cos(10)/15680/0.0003=0.0147 m=14.7 mm

Gap $d$=1 mm=0.001 m: $h$=2×0.035×cos(10)/15680/0.001=0.0044 m=4.4 mm

The capillary force resulting from the gap between the two plates is much larger than the gravitational force applied to the injected resin, for the example gap values and example resin, such that the resin wicks into the gap to a fairly significant distance under capillary action. FIG. 15B shows two plates 1049-1, 1049-2 separated by a distance d (e.g., 150 μm) with resin wicking up from reservoir 1047 to a height h (e.g., 29.2 mm).

Figure 16A:
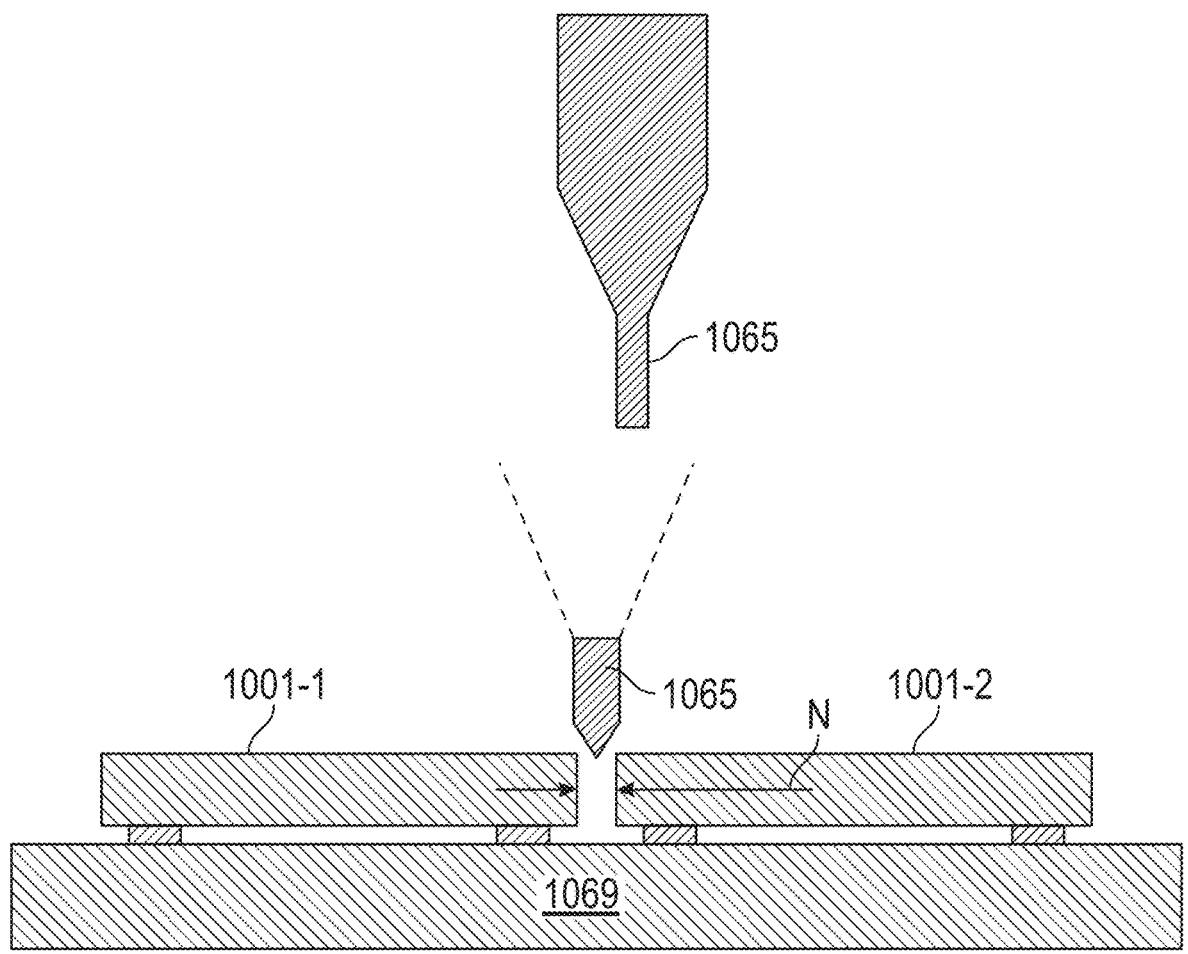
Figure 16B:
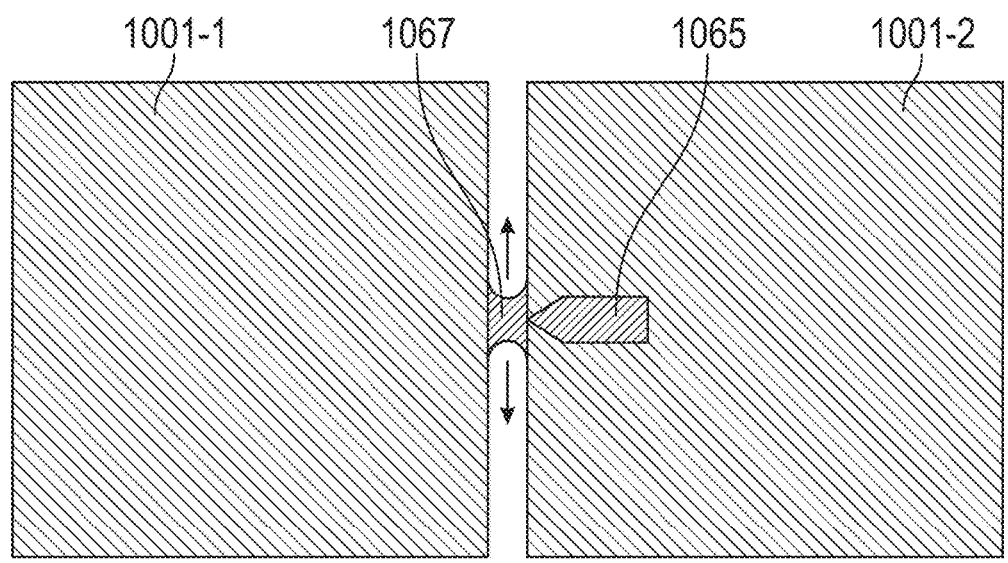

FIGS. 16A and 16B show cross sectional and top views of an example test structure. The fixture 1069 is not shown in the top view. Note the gap N between the chips 1001-1, 1001-2. Note also the needle 1065 depicted schematically adjacent the chips and in more detail at the top of FIG. 16A, as indicated by the dashed lines. Wicking of the dispensed resin 1067 into the gap between chips 1001-1, 1001-2 is suggested by the bold arrows seen in FIG. 16B. In the non-limiting example of FIGS. 16A and 16B, the chips 1001-1, 1001-2 were 19 mm square glass, 0.7 mm thick; the gap between the two chips 1001-1, 1001-2 was 380 μm, and a gap of 50 μm was present between the chips 1001-1, 1001-2 and the carrier 1069 using suitable spacers. A non-limiting example of a suitable needle 1065 is the Musashi Engineering SHN-0.15N available from Ito America Corporation of Mesa, AZ, USA, having an inner diameter of 0.15 mm and an outer diameter of 0.25 mm.

In one or more embodiments, mount two (or more) large chips 1001-1, 1001-2 on a fixture 1069, dispense pre-bind resin (capillary underfill) 1067 between the chips and cure same, pick up the pre-bound chips from the fixture, and bond a bridge chip on the pre-bound chips (for example, by formic-acid mass-reflow). Please note, the use of glass is for test purposes and the chips 1001-1, 1001-2 can be silicon or other suitable material.

Figure 17A:
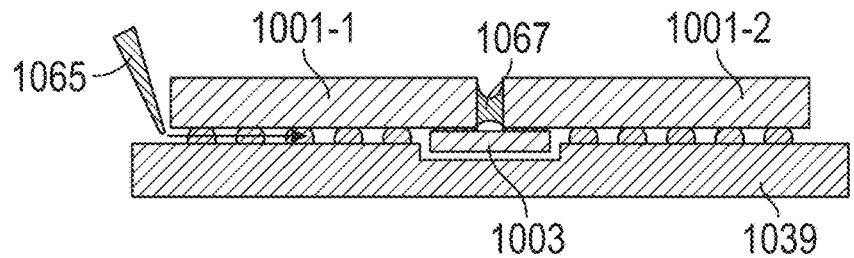

FIGS. 17A-17E show various assembly process candidates after the pre-binding step. In the non-limiting example of FIGS. 17A-17E, the bridge 1003 is secured to the large chips 1001-1, 1001-2 using micro C4 bumps, not separately numbered, and the large chips 1001-1, 1001-2 are secured to the packaging substrate 1039 using conventional C4 bumps, not separately numbered. In FIG. 17A, carry out underfill dispensing using needle 1065 from the edge of the sub-assembly (SA, i.e., the assembled top chip/bridge chip/top chip structure), as indicated by the bold arrow, not separately numbered, pointing from left to right. In the example of FIG. 17A, use formic acid reflow to secure the bridge 1003 to the large chips 1001-1, 1001-2 with the micro C4 bumps. Join the large chips to the laminate packaging substrate 1039 with the conventional C4 bumps. Introduce the capillary underfill (CUF) with the needle 1065 for both the micro C4 bumps and the conventional C4 bumps.

Figure 17B:
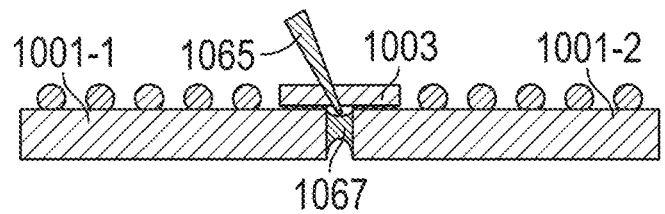
Figure 17C:
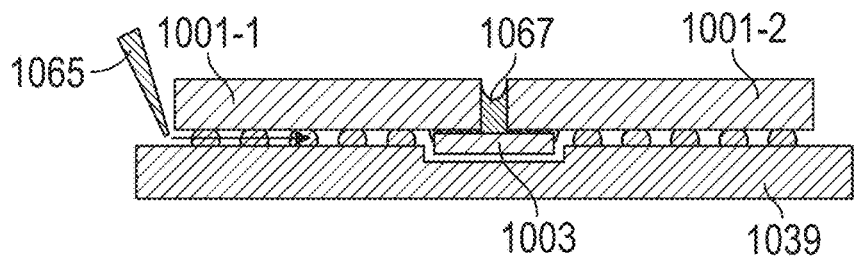

In the example of FIGS. 17B and 17C, in FIG. 17B, use formic acid reflow to secure the bridge 1003 to the large chips 1001-1, 1001-2 with the micro C4 bumps, and introduce the capillary underfill (CUF) for the micro C4 bumps with the needle 1065. In FIG. 17C, join the large chips to the laminate packaging substrate 1039 with the conventional C4 bumps. Introduce the capillary underfill (CUF) for the conventional C4 bumps using needle 1065 from the edge of the SA, as indicated by the bold arrow, not separately numbered, pointing from left to right.

Figure 17D:
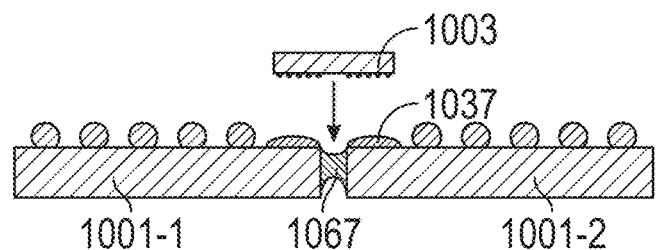

In the example of FIG. 17D, use NCP to secure the bridge 1003 to the large chips 1001-1, 1001-2 with the micro C4 bumps. Join the large chips to the laminate packaging substrate 1039 with the conventional C4 bumps (not shown in FIG. 17D, similar to FIGS. 17A and 17C). Introduce the capillary underfill (CUF) for the conventional C4 bumps using the needle (not shown in FIG. 17D, similar to FIGS. 17A and 17C).

Figure 17E:
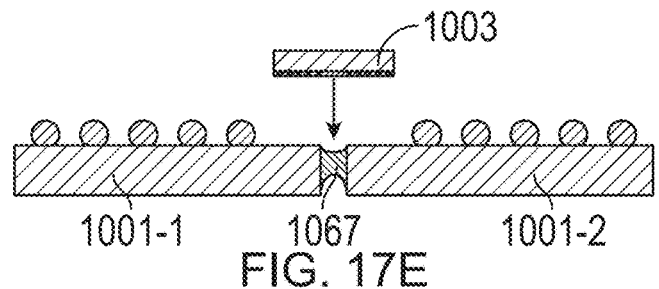

In the example of FIG. 17E, use hybrid bonding with organic insulation (i.e., hybrid bonding which is enabled by metal and insulation concurrent bonding in the same plain, as will be appreciated by the skilled artisan, who will be able to adapt known techniques to implement one or more embodiments, given the teachings herein) to secure the bridge 1003 to the large chips 1001-1, 1001-2 with the micro C4 bumps. Join the large chips to the laminate packaging substrate 1039 with the conventional C4 bumps (not shown in FIG. 17E, similar to FIGS. 17A and 17C). Introduce the capillary underfill (CUF) for the conventional C4 bumps using the needle (not shown in FIG. 17D, similar to FIGS. 17A and 17C). The hybrid bonding approach is suitable, for example, for finer-pitched joints (e.g., less than 30 μm).

In one or more embodiments, aspects of the invention reduce or eliminate the presence of mold resin on the tops of the large chips, advantageously facilitating mounting a heat sink, as compared to an overmolded multi-chip module.

Figure 19A:
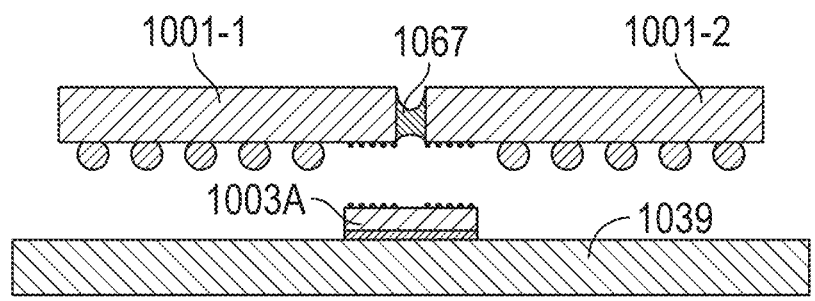
FIGS. 19A and 19B show aspects wherein a pre-bound chip assembly can be bonded onto a laminate and an interconnect chip on the laminate simultaneously.
Figure 19B:
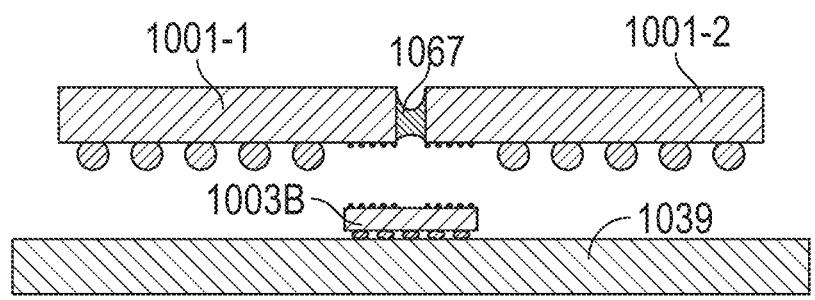

In another aspect, FIGS. 19A and 19B show examples of how a pre-bound chip assembly can be simultaneously bonded onto a laminate and an interconnect chip on the laminate. Note the large chips 1001-1, 1001-2 pre-bound to each other with pre-bind resin 1067. Note also the laminate packaging substrate 1039. In FIG. 19A, bridge 1003A is secured to laminate packaging substrate 1039 with a layer of adhesive (not separately numbered); bridge 1003A is secured to the large chips 1001-1, 1001-2 using micro C4 bumps, not separately numbered; and the large chips 1001-1, 1001-2 are simultaneously secured to the packaging substrate 1039 using conventional C4 bumps, not separately numbered. In FIG. 19B, bridge 1003B is formed with through-silicon vias (TSVs) and is secured to laminate packaging substrate 1039 with solder bumps (not separately numbered); the bridge 1003B is secured to the large chips 1001-1, 1001-2 using micro C4 bumps, not separately numbered, and the large chips 1001-1, 1001-2 are simultaneously secured to the packaging substrate 1039 using conventional C4 bumps, not separately numbered.

According to one embodiment of the present invention, a method of forming an interconnected semiconductor subassembly structure is disclosed. The method includes: bonding a first semiconductor die to a first portion of an interconnect structure, bonding a second semiconductor die to a second portion of the interconnect structure, and forming an underfill layer within a first gap located between the first semiconductor die and the first portion of the interconnect structure, within a second gap located between the second semiconductor die and the second portion of the interconnect structure, and within a first portion of a third gap located between the first semiconductor die and the second semiconductor die. A top surface of the underfill layer formed within the first portion of the third gap located between the first semiconductor die and the second semiconductor die has a concave meniscus shape.

In some cases, forming the underfill layer includes depositing an underfill material between the third gap located between the first semiconductor die and the second semiconductor die, and wherein the underfill material flows into the first and second gaps by capillary action.

In some cases, the underfill material is deposited between the third gap located between the first semiconductor die and the second semiconductor die by a jet dispenser.

In some cases, a gap length of the third gap located between the first and second semiconductor dies is greater than a gap height of the first and second gaps located between the first and second semiconductor dies and the interconnect structure, respectively.

In some cases, the interconnect structure is at least one of an interposer or a bridge.

Some cases further include bonding the interconnected semiconductor subassembly structure to a package substrate after the underfill layer has cured.

Some cases further include forming a chip binding layer on top of the underfill layer formed within the first portion of the third gap located between the first semiconductor die and the second semiconductor die, wherein a top surface of the chip binding layer has a concave meniscus shape.

In some cases, forming the chip binding layer includes depositing a chip binding material between the third gap located between the first semiconductor die and the second semiconductor die and on top of the underfill layer, and the underfill layer and the chip binding layer have at least one of a similar material composition or a different material composition.

Some cases further include bonding the interconnected semiconductor subassembly structure to a package substrate after both the underfill layer and the chip binding layer have cured.

Given the discussion thus far, it will be appreciated that an interconnected semiconductor subassembly structure, according to an aspect of the invention, includes an interconnect structure 130, 230, 903, 1003; a first semiconductor die 110, 901-1, 1001-1 bonded to a first portion of a top surface of the interconnect structure; a second semiconductor die 120, 901-2, 1001-2 bonded to a second portion of the top surface of the interconnect structure; and a resin layer 320, 420, 905, 1067. The resin layer is located within at least a first portion of a gap between the first semiconductor die and the second semiconductor die. At least one of a top surface and a bottom surface of the resin layer located within the at least first portion of the gap has a concave meniscus shape as seen, for example, at 324, 424, 909, 1063-1, 1063-2. Note that the aforementioned "resin" can be, for example, a filler-filled resin, underfill material, or the like. In one or more embodiments, the meniscus shape is created between the chips/semiconductor dies "before laminate join."

As used herein, a "meniscus" is the curve in the upper surface of a liquid close to the surface of the container or another object, caused by surface tension and a "meniscus shape" is the shape of the liquid meniscus that is retained in the cured material after curing/solidification. A "concave meniscus" as seen in the drawings dishes inwards towards the liquid and a "concave meniscus shape" is the concave shape of the liquid meniscus that is retained in the cured material after curing/solidification. A meniscus can be two-dimensional, as shown in the drawings, or 3-dimensional/spherical, as in a test tube. A meniscus can also form in association with a stud or other wicking enhancer.

Some aspects of the invention relate to a sub-assembly (chip-bridge-chip) structure before it is assembled on a substrate. Such a sub-assembly could be deliverable as a product in its own right, for example. As noted, in one or more embodiments, the meniscus shape is created between the chips/semiconductor dies "before laminate join." Thus, in some cases, the interconnected semiconductor subassembly structure, according to an aspect of the invention, includes the interconnect structure 130, 230, 903, 1003; the first semiconductor die 110, 901-1, 1001-1 bonded to the first portion of the top surface of the interconnect structure; the second semiconductor die 120, 901-2, 1001-2 bonded to the second portion of the top surface of the interconnect structure; and the resin layer 320, 420, 905, 1067. The resin layer is, as noted, located within at least a first portion of the gap between the first semiconductor die and the second semiconductor die. At least one of the top surface and the bottom surface of the resin layer that is located within the at least first portion of the gap has a concave meniscus shape as seen, for example, at 324, 424, 909, 1063-1, 1063-2. In the interconnected semiconductor subassembly structure just described, in one or more embodiments, the subassembly per se exists without being attached to/assembled on a substrate; i.e., no substrate is present.

In one or more embodiments, a first gap is located between a bottom surface of the first semiconductor die 110, 901-1, 1001-1 and the first portion of the top surface of the interconnect structure 130, 230, 903, 1003; a second gap is located between the bottom surface of the second semiconductor die 120, 901-2, 1001-2 and the second portion of the top surface of the interconnect structure 130, 230, 903, 1003; and the aforementioned gap between the first semiconductor die and the second semiconductor die is referred to for convenience as a third gap. The resin layer is further located within at least a portion of the first gap and at least a portion of the second gap. See, for example, FIGS. 11E, 17C. At least the top surface of the resin layer located within the third gap has the concave meniscus shape 324, 424, 909, 1063-1. In one or more exemplary embodiments, the first and second gaps are filled 100% to protect all the metal joints on the bridge chip, while the fill of the third gap is dependent on the aspect ratio of the gap. In an exemplary, non-limiting case, it is 50-80% of the total volume of the gap.

One or more embodiments further include a chip binding layer 520, 620 formed on top of the resin layer formed within the first portion of the third gap located between the first semiconductor die and the second semiconductor die. A top surface of the chip binding layer has a concave meniscus shape and is located below a top surface of the first and second semiconductor dies, respectively.

In general, the resin layer and the chip binding layer can have a similar or a different material composition.

In one or more embodiments, the gap length of the third gap located between the first and second semiconductor dies is greater than the gap height of the first and second gaps located between the first and second semiconductor dies and the interconnect structure, respectively. For example, as depicted in FIG. 1, gap length 192 of gap 190 is greater than gap height 184 of gaps 180 and 186, respectively. This stems from the fact that in accordance with embodiments of the present invention, a resin material 310 (depicted in FIG. 3) is initially dispensed within gap 190, and subsequently flows between gaps 180 and 186 via capillary action to form resin layer 320 (depicted in FIG. 3). In an embodiment, gap length 182 of gaps 180 and 186 is greater than or equal to 50 μm and less than or equal to 500 μm. In an embodiment, gap height 184 of gaps 180 and 186 is greater than or equal to 5 μm and less than or equal to 100 In another non-limiting example, as per FIG. 12, the large chip to large chip distance A can be about 80 the bridge chip can be about 2.5 by 60 mm, and the large chip to bridge chip distance D can be about 20 μm.

In a non-limiting example, the gap height of the first and second gaps located between the first and second semiconductor dies and the interconnect structure, respectively, is greater than or equal to 5 μm and less than or equal to 100 In some cases, the large chip to large chip range can be 50-500 From the viewpoint of the stud invention discussed elsewhere herein, in some cases, the large chip to large chip range can also be about 5 to about 500 However, other methods (e.g., needle dispensing directly on bridge chip or substrate, jet dispensing, etc.) can also be used for a larger gap even in that range.

In one or more embodiments, the various distances are selected so that the capillary force will draw the fill material out of the space between the large chips and into the space between the large chips and the interconnect.

The interconnect structure can be, for example, an interposer or a bridge.

In one or more embodiments, the first and second semiconductor dies are bonded to the interconnect structure by a plurality of micro metal joints (e.g., micro bumps 170) (e.g., in some cases, less than 100 μm pitch). In another non-limiting example (e.g., in cases such as the stud embodiments), the micro joint diameter and height can be about 5 to about 50 μm.

Figure 18A:
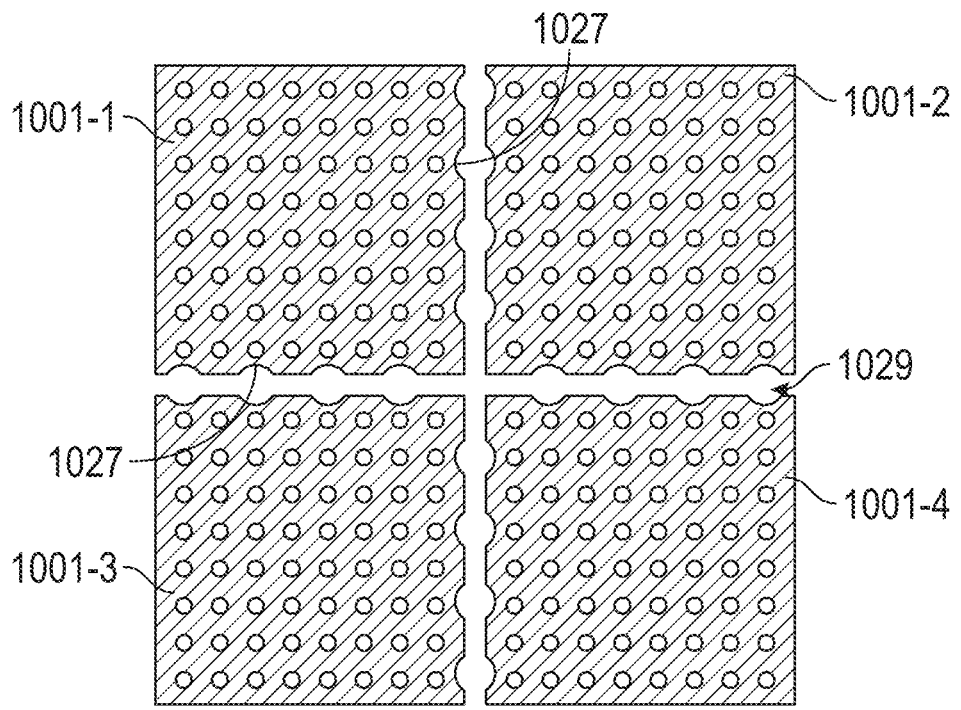
FIGS. 18A-18C show wicking enhancers, in accordance with at least one embodiment of the present invention.
Figure 18B:
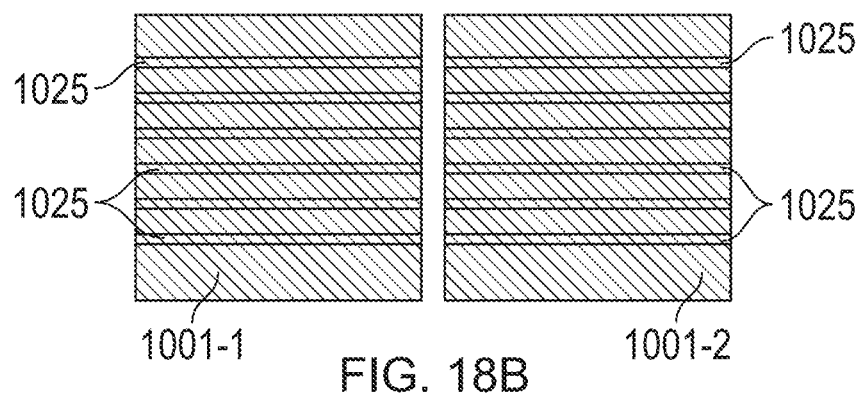
Figure 18C:
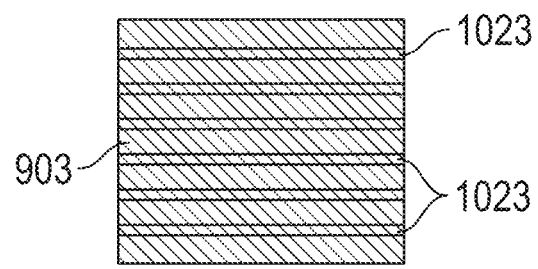

One or more embodiments further include at least one wicking enhancer positioned to enhance wicking in at least one of the first gap, the second gap, and the third gap. The wicking enhancer can include, for example, any of the various stud configurations. Other types of wicking enhancers are possible. For example, in FIG. 18A, the kerf areas 1029 between the large chips 1001-1, 1001-2, 1001-3, 1001-4 include drilled regions 1027 to aid in wicking the fill material. FIG. 18B shows grooves 1025 on the undersides of the large chips 1001-1, 1001-2 to aid in drawing fill material into the interposer-large chip gaps. FIG. 18C shows grooves 1023 on the upper side of the interposer 903 to aid in drawing fill material into the interposer-large chip gaps.

In one or more embodiments, the at least one wicking enhancer includes at least one stud located at least partially within the first portion of the third gap. The at least one stud is attached to at least one of the interconnect structure, the first semiconductor die, and the second semiconductor die. Regarding how much of the stud should be in the gap, it depends on the underfill volume which is dispensed in the gap between the large chips. In the case that only a fraction of the stud is in the gap between two large chips, more underfill needs to fill the gap; less underfill needs to fill the gap in case that a tall stud is used.

As seen, for example, in FIG. 9F, in some cases, the at least one stud is a vertical post 907-1 attached to the interconnect structure. As seen, for example, in FIG. 9A, in some cases, the at least one stud 907-1 does not touch the first semiconductor die or the second semiconductor die.

As seen, for example, in FIG. 9C, in some cases, the at least one stud 907-3, 907-4 is attached to at least one of the first semiconductor die and the second semiconductor die.

As seen, for example, in FIGS. 9D and 9J, in some cases, the at least one stud 907-5 is a rectangular prism attached edge-on to the interconnect structure, and it has a long axis running between the first semiconductor die and the second semiconductor die.

As seen, for example, in FIG. 9I, in some cases, the at least one stud includes a first dummy bump on the interconnect structure touching a corner of the first semiconductor die adjacent the third gap and a second dummy bump on the interconnect structure touching a corner of the second semiconductor die adjacent the third gap. Many other stud configurations are possible; e.g., resin dam stud of FIG. 9L.

As seen, for example, in FIGS. 10A-10D, in some instances, a permanent reservoir 999, 999-1, 999-2, 999-3 is located in at least one of the first semiconductor die and the second semiconductor die in communication with the third gap.

In some cases, as seen, for example, in FIGS. 14B, 14C, and 17A, the top surface and the bottom surface of the resin layer located within the at least first portion of the (third) gap each have a concave meniscus shape.

In another aspect, an exemplary method of forming an interconnected semiconductor subassembly structure includes bonding a first semiconductor die 110, 901-1, 1001-1 to a first portion of a top surface of an interconnect structure 130, 230, 903, 1003; bonding a second semiconductor die 120, 901-2, 1001-2 to a second portion of the top surface of the interconnect structure; and, via capillary action, forming a pre-bind resin layer 320, 420, 905, 1067 within at least a first portion of a gap between the first semiconductor die and the second semiconductor die. At least one of the top surface and the bottom surface of the resin layer has a concave meniscus shape, as discussed elsewhere herein. In one or more embodiments, the meniscus shape is created between the chips/semiconductor dies "before laminate join."

It is worth noting that both jet and pen embodiments (including pre-bind) can use formation by capillary action; in the case of the jet embodiment, the jet action itself is not capillary action but the jetted dots flow into the gap by capillary action.

In one or more embodiments, the bonding of the first semiconductor die to the first portion of the interconnect structure defines a first gap located between a bottom surface of the first semiconductor die and the first portion of the top surface of the interconnect structure; and the bonding of the second semiconductor die to the second portion of the interconnect structure defines a second gap located between a bottom surface of the second semiconductor die and the second portion of the top surface of the interconnect structure. The aforementioned gap between the first semiconductor die and the second semiconductor die is referred to for convenience as a third gap. Forming the resin layer via capillary action further includes forming the resin layer within at least a portion of the first gap and at least a portion of the second gap via the capillary action. At least the top surface of the resin layer located within the third gap has the concave meniscus shape.

In some cases, in the steps of bonding the first and second semiconductor dies, the gap length of the third gap located between the first and second semiconductor dies is greater than the gap height of the first and second gaps located between the first and second semiconductor dies and the interconnect structure, respectively, as discussed elsewhere herein.

In some cases, the resin material is deposited between the third gap located between the first semiconductor die and the second semiconductor die by a jet dispenser. As noted, the interconnect structure can be, for example, an interposer or a bridge. One or more embodiments further include bonding the interconnected semiconductor subassembly structure to a package substrate after the resin layer has cured. One or more embodiments further include forming a chip binding layer on top of the resin layer formed within the first portion of the third gap located between the first semiconductor die and the second semiconductor die; the top surface of the chip binding layer has a concave meniscus shape. One or more embodiments further include bonding the interconnected semiconductor subassembly structure to a package substrate after both the resin layer and the chip binding layer have cured.

Some instances further include depositing a chip binding material within the third gap on top of the resin layer; the resin layer and the chip binding layer have the same or different material composition, as discussed elsewhere herein.

In some (e.g., pre-binding) embodiments, the step of forming the resin layer within the at least first portion of the gap between the first semiconductor die and the second semiconductor die via capillary action is carried out prior to bonding the first semiconductor die to the first portion of the top surface of the interconnect structure and bonding the second semiconductor die to the second portion of the top surface of the interconnect structure.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. An interconnected semiconductor subassembly structure, comprising:
    an interconnect structure;
    a first semiconductor die bonded to a first portion of a top surface of the interconnect structure;
    a second semiconductor die bonded to a second portion of the top surface of the interconnect structure; and
    a resin layer located within at least a first portion of a gap between the first semiconductor die and the second semiconductor die, wherein a top surface and a bottom surface of the resin layer located within the at least first portion of the gap each have a concave meniscus shape.

2. The interconnected semiconductor subassembly structure of claim 1, wherein:
    the gap between the first semiconductor die and the second semiconductor die comprises a third gap;
    a first gap is located between a bottom surface of the first semiconductor die and the first portion of the top surface of the interconnect structure; and
    a second gap is located between the bottom surface of the second semiconductor die and the second portion of the top surface of the interconnect structure;
    further comprising capillary underfill located within at least a portion of the first gap and at least a portion of the second gap.

3. The interconnected semiconductor subassembly structure of claim 2, wherein a gap length of the third gap located between the first and second semiconductor dies is greater than a gap height of the first and second gaps located between the first and second semiconductor dies and the interconnect structure, respectively.

4. The interconnected semiconductor subassembly structure of claim 3, wherein a gap height of the first and second gaps located between the first and second semiconductor dies and the interconnect structure, respectively, is greater than or equal to 5 μm and less than or equal to 100 μm, and the third gap is greater than or equal to 50 μm and less than or equal to 500 μm.

5. The interconnected semiconductor subassembly structure of claim 2, wherein the first and second semiconductor dies are bonded to the interconnect structure by a plurality of micro metal joints.

6. The interconnected semiconductor subassembly structure of claim 1, further comprising:
a package substrate; and
a plurality of solder bumps electrically connected between the package substrate and the first semiconductor die and between the package substrate and the second semiconductor die.

7. The interconnected semiconductor subassembly structure of claim 6, further comprising at least one wicking enhancer positioned to enhance wicking in at least one of the first gap, the second gap, and the third gap,
wherein the at least one wicking enhancer comprises at least one stud located at least partially within the first portion of the third gap, the at least one stud being attached to at least one of the interconnect structure, the first semiconductor die, and the second semiconductor die.

8. The interconnected semiconductor subassembly structure of claim 7, wherein the at least one stud comprises a vertical post attached to the interconnect structure.

9. The interconnected semiconductor subassembly structure of claim 8, wherein the at least one stud does not touch the first semiconductor die or the second semiconductor die.

10. The interconnected semiconductor subassembly structure of claim 7, wherein the at least one stud is attached to at least one of the first semiconductor die and the second semiconductor die.

11. The interconnected semiconductor subassembly structure of claim 7, wherein the at least one stud comprises a rectangular prism attached edge-on to the interconnect structure and having a long axis running between the first semiconductor die and the second semiconductor die.

12. The interconnected semiconductor subassembly structure of claim 7, wherein the at least one stud comprises a first dummy bump on the interconnect structure touching a corner of the first semiconductor die adjacent the third gap and a second dummy bump on the interconnect structure touching a corner of the second semiconductor die adjacent the third gap.

13. The interconnected semiconductor subassembly structure of claim 7, further comprising a permanent reservoir located in at least one of the first semiconductor die and the second semiconductor die in communication with the third gap.

14. A method of forming an interconnected semiconductor subassembly structure, comprising:
bonding a first semiconductor die to a first portion of a top surface of an interconnect structure;
bonding a second semiconductor die to a second portion of the top surface of the interconnect structure; and
via capillary action, forming a resin layer within at least a first portion of a gap between the first semiconductor die and the second semiconductor die, at least one of a top surface and a bottom surface of the resin layer having a concave meniscus shape,
wherein the step of forming the resin layer within the at least first portion of the gap between the first semiconductor die and the second semiconductor die via capillary action is carried out prior to bonding the first semiconductor die to the first portion of the top surface of the interconnect structure and bonding the second semiconductor die to the second portion of the top surface of the interconnect structure.

15. The method of claim 14, wherein:
the gap between the first semiconductor die and the second semiconductor die comprises a third gap;
the bonding of the first semiconductor die to the first portion of the interconnect structure defines a first gap located between a bottom surface of the first semiconductor die and the first portion of the top surface of the interconnect structure; and
the bonding of the second semiconductor die to the second portion of the interconnect structure defines a second gap located between a bottom surface of the second semiconductor die and the second portion of the top surface of the interconnect structure;
further comprising dispensing capillary underfill within at least a portion of the first gap and at least a portion of the second gap.

16. The method of claim 15, wherein, in the steps of bonding the first and second semiconductor dies, a gap length of the third gap located between the first and second semiconductor dies is greater than a gap height of the first and second gaps located between the first and second semiconductor dies and the interconnect structure, respectively.

17. The method of claim 15, further comprising:
prior to forming the resin layer, positioning the first semiconductor die on a first portion of a top surface of a carrier;
prior to forming the resin layer, positioning the second semiconductor die on a second portion of the top surface of the carrier; and
forming the resin layer within the at least first portion of the gap between the first semiconductor die and the second semiconductor die via the capillary action, while the first and second semiconductor dies are positioned on the carrier, with both the top surface and the bottom surface of the resin layer having the concave meniscus shape.

18. The method of claim 17, wherein the interconnect structure comprises a bridge facing the bottom surface of the resin layer.

19. The method of claim 17, further comprising joining the first semiconductor die and the second semiconductor die to a laminate packaging substrate.

20. The method of claim 14, wherein the interconnect structure is selected from the group consisting of a bridge, an interposer, and a redistribution layer (RDL).

21. The interconnected semiconductor subassembly structure of claim 1, wherein the interconnect structure is selected from the group consisting of a bridge, an interposer, and a redistribution layer (RDL).

22. An interconnected semiconductor subassembly structure comprising:
an interconnect structure;
a first semiconductor die bonded to a first portion of a top surface of the interconnect structure;
a second semiconductor die bonded to a second portion of the top surface of the interconnect structure;
a resin layer located within at least a first portion of a gap between the first semiconductor die and the second semiconductor die; and
a chip binding layer formed on top of the resin layer formed within the first portion of the gap located between the first semiconductor die and the second semiconductor die, wherein a top surface of the chip binding layer has a concave meniscus shape and is located below a top surface of the first and second semiconductor dies, respectively.

* * * * *